United States Patent
Teshima et al.

(10) Patent No.: US 7,321,366 B2
(45) Date of Patent: Jan. 22, 2008

(54) METHOD AND PROGRAM FOR CONVERTING BOUNDARY DATA INTO CELL INNER SHAPE DATA

(75) Inventors: Yoshinori Teshima, Wako (JP); Kiwamu Kase, Wako (JP); Shugo Usami, Wako (JP); Akitake Makinouchi, Wako (JP)

(73) Assignee: Riken, Saitama (JP)

( * ) Notice: Subject to any disclaimer, the term of this patent is extended or adjusted under 35 U.S.C. 154(b) by 263 days.

(21) Appl. No.: 10/505,224

(22) PCT Filed: Feb. 27, 2003

(86) PCT No.: PCT/JP03/02197

§ 371 (c)(1),
(2), (4) Date: Aug. 20, 2004

(87) PCT Pub. No.: WO03/073335

PCT Pub. Date: Sep. 4, 2003

(65) Prior Publication Data

US 2005/0216238 A1   Sep. 29, 2005

(30) Foreign Application Priority Data

Feb. 28, 2002 (JP) .............................. 2002-053575

(51) Int. Cl.
*G06T 17/00* (2006.01)

(52) U.S. Cl. ..................................................... 345/424
(58) Field of Classification Search ................. 345/424
See application file for complete search history.

(56) References Cited

U.S. PATENT DOCUMENTS 4,092,201 A   5/1978   Wommelsdorf (Continued)

FOREIGN PATENT DOCUMENTS

EP   0 938 949 A1   9/1999

(Continued)

OTHER PUBLICATIONS

Ake Wallin, Constructing Isosurfaces from CT data, 1991, IEEE Computer Graphics and Applications, pp. 28-33.*

(Continued)

*Primary Examiner*—Ulka Chauhan
*Assistant Examiner*—Dan Washburn
(74) *Attorney, Agent, or Firm*—Griffin & Szipl, P.C.

(57) ABSTRACT

A method and a program for converting boundary data into cell inner shape data, includes a division step (A) of dividing external data (12) constituted of the boundary data of an object into cells (13) in an orthogonal grid, a cutting point deciding step (B) of deciding an intersection point of the boundary data and a cell edge as a cell edge cutting point, a boundary deciding step (C) of deciding a boundary formed by connecting the cell edge cutting points as the cell inner shape data, a cell classification step (D) of classifying the divided cells into a nonboundary cell (13a) including no boundary surface and a boundary cell (13b) including a boundary surface, and a boundary cell data classification step (E) of classifying cell data constituting the boundary cell into internal cell data inside the cell inner shape data and external cell data outside the cell inner shape data.

18 Claims, 15 Drawing Sheets

U.S. PATENT DOCUMENTS

| | | | |
|---|---|---|---|
| 4,665,492 A | | 5/1987 | Masters |
| 4,694,404 A | | 9/1987 | Meagher |
| 4,710,876 A | * | 12/1987 | Cline et al. ............... 345/423 |
| 4,719,585 A | * | 1/1988 | Cline et al. ............... 345/424 |
| 4,729,098 A | * | 3/1988 | Cline et al. ............... 345/421 |
| 5,095,419 A | | 3/1992 | Seki et al. |
| 5,166,876 A | * | 11/1992 | Cline et al. ............... 345/424 |
| 5,197,013 A | | 3/1993 | Dundorf |
| 5,303,141 A | | 4/1994 | Batchelder et al. |
| 5,345,490 A | | 9/1994 | Finnigan et al. |
| 5,510,066 A | | 4/1996 | Fink et al. |
| 5,517,602 A | | 5/1996 | Natarajan |
| 5,594,652 A | | 1/1997 | Penn et al. |
| 5,796,617 A | | 8/1998 | St. Ville |
| 5,807,448 A | | 9/1998 | Nakazawa |
| 6,075,538 A | | 6/2000 | Shu et al. |
| 6,136,252 A | | 10/2000 | Bedal et al. |
| 6,214,279 B1 | | 4/2001 | Yang et al. |
| 6,405,095 B1 | | 6/2002 | Jang et al. |
| 6,445,390 B1 | | 9/2002 | Aftosmis et al. |
| 6,471,800 B2 | | 10/2002 | Jang et al. |
| 6,504,742 B1 | | 1/2003 | Tran et al. |
| 6,606,528 B1 | | 8/2003 | Hagmeier et al. |
| 6,618,607 B2 | | 9/2003 | Song |
| 6,627,835 B1 | | 9/2003 | Chung et al. |
| 6,639,597 B1 | | 10/2003 | Zwicker et al. |
| 6,643,560 B2 | | 11/2003 | Shimomura |
| 6,968,075 B1 | | 11/2005 | Chang |
| 6,982,710 B2 | * | 1/2006 | Salomie ............... 345/420 |
| 7,088,363 B2 | | 8/2006 | Kase et al. |
| 7,110,852 B2 | | 9/2006 | Ohmori et al. |
| 2002/0004713 A1 | | 1/2002 | Wakabayashi et al. |
| 2002/0055692 A1 | | 5/2002 | Tanaka et al. |
| 2002/0113331 A1 | | 8/2002 | Zhang et al. |
| 2003/0001836 A1 | | 1/2003 | Ernst et al. |
| 2004/0267400 A1 | | 12/2004 | Ohmori et al. |
| 2005/0015173 A1 | | 1/2005 | Ohmori et al. |
| 2006/0228248 A1 | | 10/2006 | Larsson |

FOREIGN PATENT DOCUMENTS

| | | |
|---|---|---|
| EP | 1 229 463 A2 | 8/2002 |
| JP | 02-236677 | 9/1990 |
| JP | 03-021432 | 1/1991 |
| JP | 04-075850 | 3/1992 |
| JP | 06-315849 | 11/1994 |
| JP | 6-348862 A | 12/1994 |
| JP | 07-057089 | 3/1995 |
| JP | 07-334541 | 12/1995 |
| JP | 10-063873 | 3/1998 |
| JP | 11-096400 | 4/1999 |
| JP | 2000-182081 | 6/2000 |
| JP | 2000-194881 | 7/2000 |
| JP | 2000-340476 | 12/2000 |
| JP | 2001-022961 | 1/2001 |
| JP | 2001-025023 | 1/2001 |
| JP | 2001-370040 | 4/2001 |
| JP | 2001-225393 | 8/2001 |
| JP | 2002-024306 | 1/2002 |
| JP | 2002-230054 | 8/2002 |
| JP | 2003-044528 | 2/2003 |
| WO | 02/23406 A1 | 3/2002 |

OTHER PUBLICATIONS

Ajay Kela, Hierarchical octree approximations for boundary representation-based geometric models, 1989, Computer-Aided Design, pp. 355-362.*

Yonekawa, Kazutoshi et al, "Kukan Bunkatsu Model o Mochiita Keijo Modeler", Transactions of Information Processing Society of Japan, vol. 37, No. 1, pp. 60 to 69, Jan. 15, 1996.

Avila, Ricardo S., et al., "A Haptic Interaction Method for Volume Visualization," Oct. 27, 1996, pp. 197-204.

Ayala, D., et al., "Object Representation by Means of Nonminimal Division Quadtrees and Octrees," ACM Transactions on Graphics, Jan. 1985, pp. 41-59, vol. 4, No. 1.

Hoffmann, Christoph M., "The Problems of Accuracy and Robustness in Geometric Computation", Mar. 1989, pp. 31-41.

Ju, Tao, et al. "Dual Contouring of Hermite Data," pp. 1-8, 2002.

Kase, K. et al., "Volume CAD", Volume Graphics, pp. 145-173, 2003.

Lorensen, William E. et al., "Marching Cubes: A High Resolution 3D Surface Construction Algorithm", Computer Graphics, vol. 21, No. 4, pp. 163-169, 1987.

Navazo, I. et al., "A Geometric Modeller based on the Exact Octtree Representation of Polyhedra", Computer Graphics Forum 5, pp. 91-104, 1986.

Navazo, I., "Extended Octtree Representation of General Solids with Plane Faces; Model Structure and Algorithms", Comput. & Graphics, vol. 13, No. 1, pp. 5-16, 1989.

Roy, U., et al., "Computation of a geometric model of a machined part from its NC machining programs," Computer-Aided Design, 1999, pp. 401-411, No. 31.

Shute, Gary, "Overview of C Programming," Aug. 23, 1999, http://www.d.umn.edu/~gshute/C/overview.html, printed Nov. 1, 2004.

Teshima, Yoshinori et al., "Shape Approximation, Cube Cutting and Enumeration", ISM Symposium 2003—Statistics, Combinatorics and Geometry-20-22, p. 9, 2003.

Yamaguchi, K. et al, "Computer-Integrated Manufacturing of Surfaces Using Octree Encoding," IEEE CG&A, Jan. 1984, pp. 60-62.

Zesheng, Tang, "Octree Representation and its Applications in CAD," Journal of Computer Science and Technology, 1992, pp. 29-38, vol. 7, No. 1.

Office Action issued in related U.S. Appl. No. 10/482,919 filed Feb. 7, 2007.

Kobbelt, Leif P. et al., "Feature Sensitive Surface Extraction from Volume Data," ACM SIGGRAPH 2001, Aug. 12-17, 2001, pp. 47-66.

Brunet, Pere et al., "Solid Representation and Operation Using Extended Octrees," ACM Transactions on Graphics, vol. 9, No. 2, Apr. 1990, pp. 170-197.

Pfister, Hanspeter et al., "Cube-4—A Scalable Architecture for Real-Time Volume Rendering," IEEE 1996, pp. 47-54, 100.

Wallin, Ake, "Constructing Isosurfaces from CT Data," IEEE Computer Graphics & Applications, IEEE 1991, pp. 28-33.

Office Action dated May 7, 2007 in related U.S. Appl. No. 10/486,653.

Haley, Michael B., "Incremental Volume Rendering Using Hierarchical Compression," Eurographics '96 vol. 15, No. 3, 1996, pp. 45-55.

Ward, Gregory J., "The RADIANCE Lighting Simulation and Rendering System," Computer Graphics Proceedings, Annual Conference Series, 1994, pp. 459-472.

Roy, Uptal et al., "3-D Object Decomposition with Extended Octree Model and its Application in Geometric Simulation of NC Machining," Robotics and Computer-Integrated Manufacturing 14, 1998, pp. 317-327.

Shepard, M.S. et al., "Parallel Automatic Adaptive Analysis," Parallel Computing 23, 1997, pp. 1327-1347.

European Search Report issued in related application No. EP 02743831.6, completed Mar. 23, 2007 and mailed Apr. 3, 2007.

Okamoto, Katsunari et al., "Stress Analysis of Optical Fibers by a Finite Element Method," Oct. 1981, IEEE vol. QE-17, No. 10, pp. 2123-2129.

Office Action issued in related U.S. Appl. No. 10/482,919, dated Jun. 29, 2007.

Ramesh, R., et al. "Error Compensation in machine tools - a review Part 1: geometric, cutting-force induced and fixture-dependent errors,"International Journal of Machine Tools & Manufacture 40 (2000) pp. 1235-1256.

Liu, Quing, "Form-Accuracy Analysis and Prediction in Computer-Integrated Manufacturing," International Journal of Machine Tools & Manufacture, vol. 37, No. 3, 1997, pp. 234-248.

Supplementary European Search Report issued in related application No. EP 02 76 0631, completed Sep. 12, 2007.

Office Action issued in related U.S. Appl. No. 10/595,047, dated Sep. 28, 2007.

* cited by examiner mc-0 mc-1 mc-2 mc-3

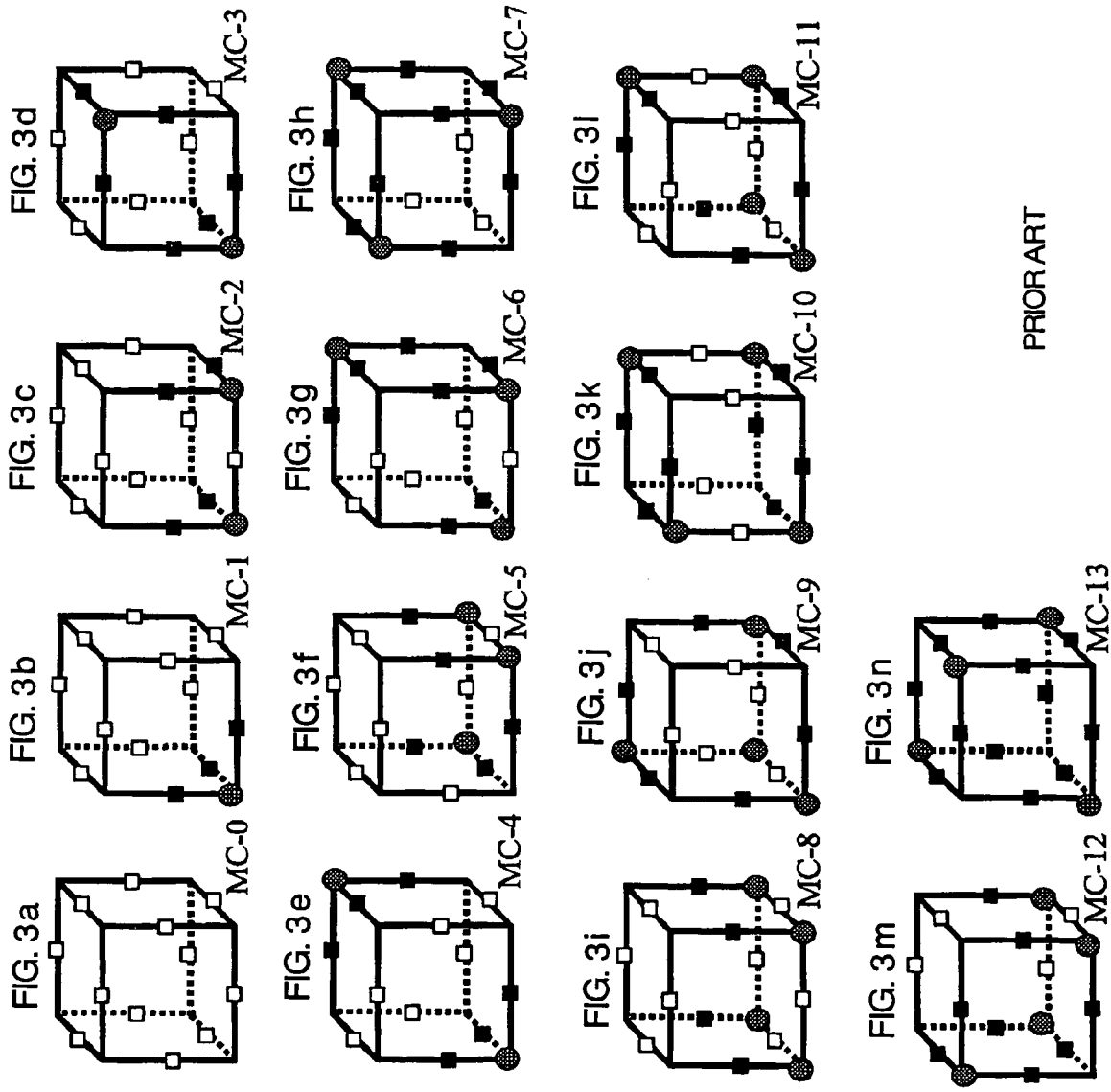

2D-KTC

2D-MC

(MC)

NARROW-SENSE

CONDITION THAT NUMBER OF CUTTING POINTS ON ONE EDGE IS AT MOST ONE (KTC)

BROAD-SENSE

CONDITION THAT NUMBER OF CUTTING POINTS ON ONE EDGE IS AT MOST ONE

FIG. 7a          FIG. 7b          FIG. 7c
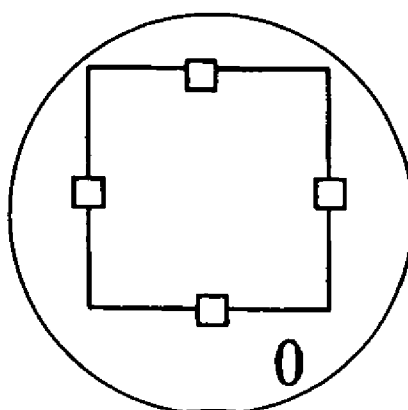
0
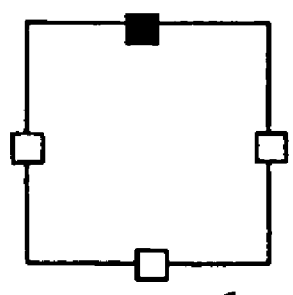
1
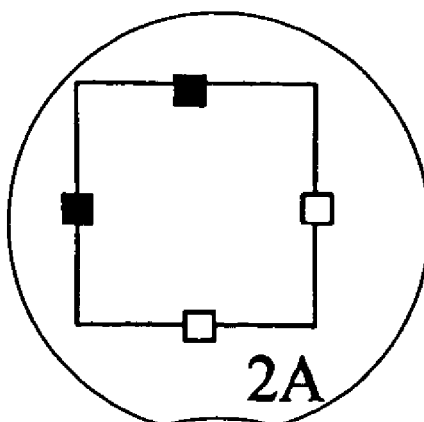
2A
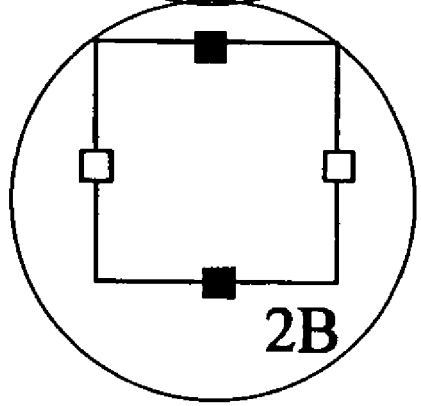
2B
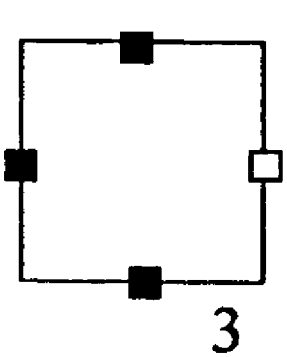
3
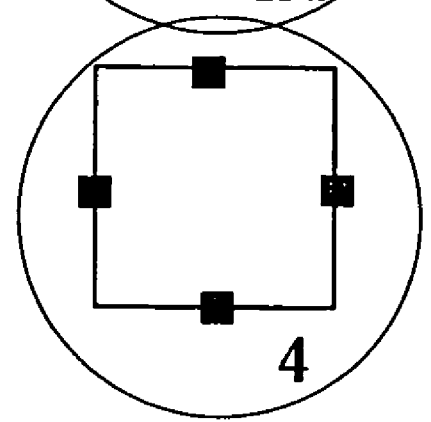
4
FIG. 7d          FIG. 7e          FIG. 7f

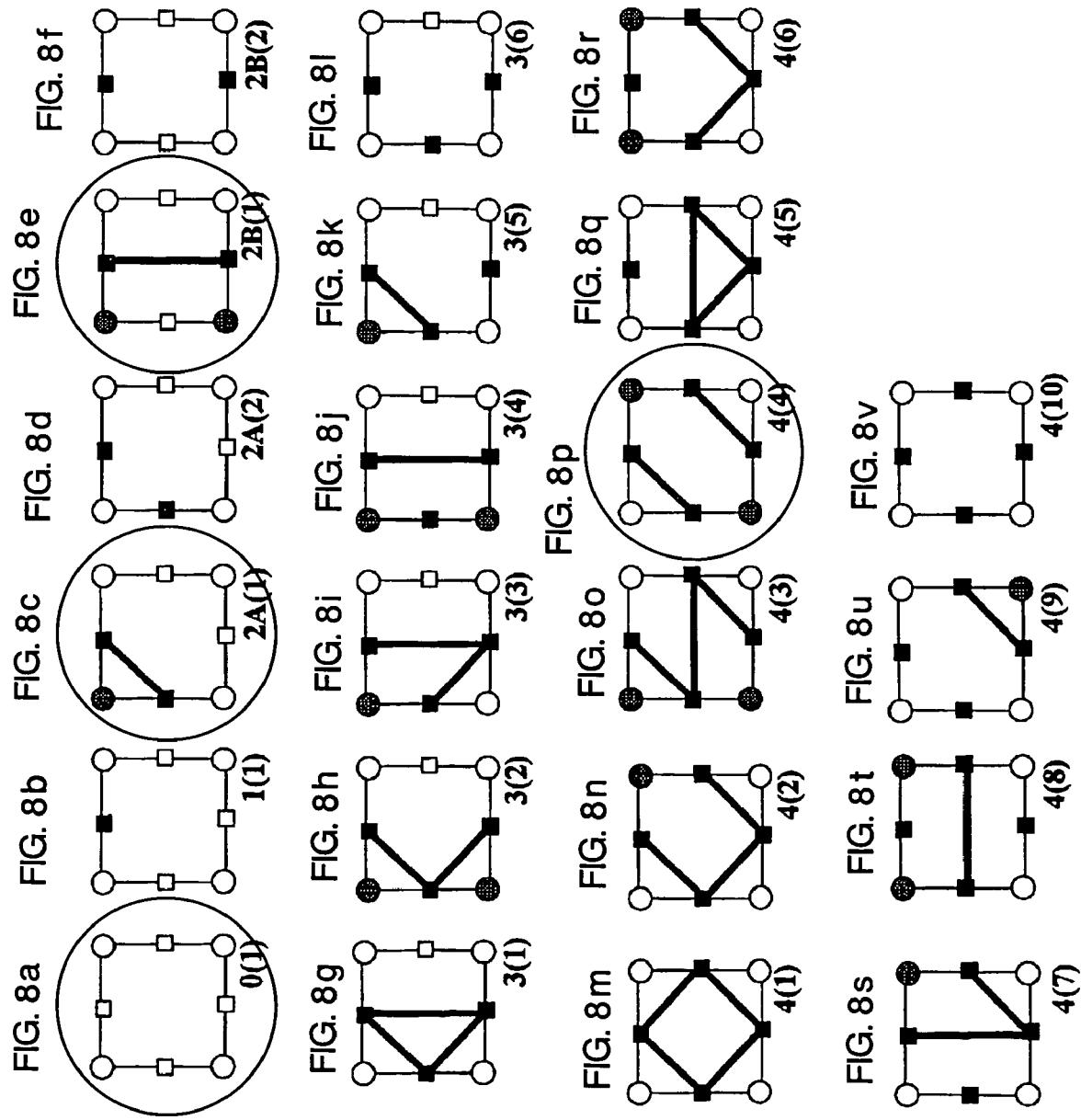

6-28

FIG. 15
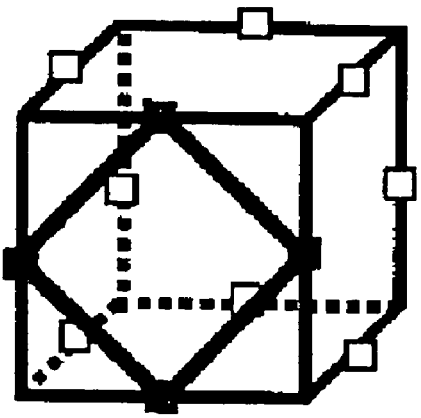
FIG. 16a
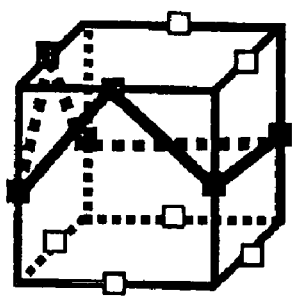
FIG. 16b
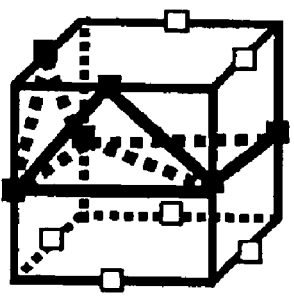
FIG. 16c
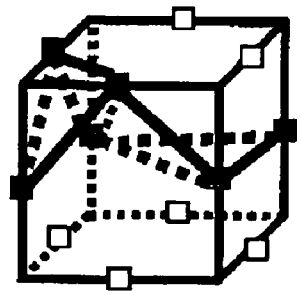
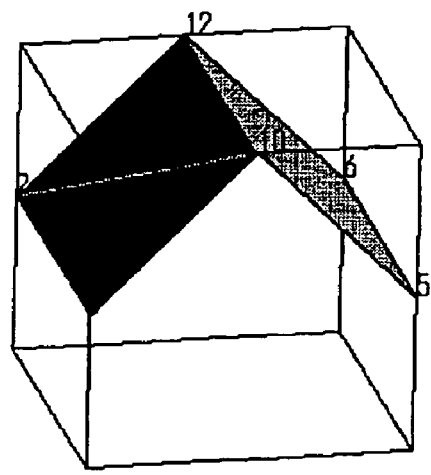
FIG. 16d Reconstruction using partitions of the closed loop type.
B-rep data: (a) A cyclide surface, (b) A die from TSUBAMEX.
Reconstructions with partitions inside (c) 64*64*64 cells and (d) 512*512*512 cells.

METHOD AND PROGRAM FOR CONVERTING BOUNDARY DATA INTO CELL INNER SHAPE DATA

This is a National Phase Application in the United States of International Patent Application No. PCT/JP03/02197 filed Feb. 27, 2003, which claims priority on Japanese Patent Application No. 053575/2002, filed Feb. 28, 2002. The entire disclosures of the above patent applications are hereby incorporated by reference.

BACKGROUND OF THE INVENTION

1. Technical Field of the Invention

The present invention relates to a method for storing substantial data which can unify CAD and simulation by storing the substantial data that integrates a shape and physical properties by a small storage capacity, and more particularly to a method and a program for converting boundary data into cell inner shape data.

2. Description of the Related Art

In a field of advanced research and development/technical developments, a higher level/complexity thereof has made a great many trials and errors absolutely necessary, increasing risks in the middle of developments. In Japan that depends on science and technology for its survival, it is extremely important to achieve an unprecedentedly high level/efficiency of a development process by eliminating such risks as many as possible.

In the field of research and development/technical developments, computer aided design (CAD), computer aided manufacturing (CAM), computer aided engineering (CAE), computer aided testing (CAT), and the like are currently used as simulation means of designing, fabricating, analyzing and testing.

Because of the present invention, it is expected that cooperative simulation (C-Simulation) which is continuous simulation, advanced CAM (A-CAM) which takes a fabrication process into consideration, deterministic fabrication (D-fabrication) which can achieve ultimate accuracy, and the like will come into wide use.

According to such conventional simulation means, data of an object is stored based on constructive solid geometry (CSG) or boundary representation (B-rep).

In the case of the CSG, however, the entire object is stored as an aggregation of very small solid models. Consequently, if data is heavy and simulation means (software or the like) is mounted, enormous data must be processed, causing a problem of much time necessary for analysis even when a large scale computer is used.

In the case of the B-rep, the object is represented by a boundary. Thus, while data is light and an amount of data is small, there is not direct information regarding the inside of a boundary surface, causing a problem of unsuitability to deformation analysis or the like if no change is made.

Furthermore, according to the conventional data storage means, each time thermal/fluid analysis, large solid analysis, coupled analysis thereof or the like is carried out, division is made in a mesh form or the like suited to the analysis, and a result of the analysis can be displayed or the like to apply a finite element method or the like. However, unification of CAD and simulation is difficult, causing a problem of impossibility of managing the processes of designing, analyzing, fabricating, assembling, testing and the like based on the same data.

In other words, the following problems are inherent in the current solid/surface-CAD (referred to as S-CAD hereinafter):

(1) data is not passed, inferior in internal conversion operation (problems of numerical value error and processing method);
(2) direct use is impossible for simulation (mesh must be formed); and
(3) investigation of fabrication by CAM is impossible (only last shape is given).

Additionally, the following problems are inherent in fabrication:

(1) a fabrication process cannot be represented (rough fabrication or process design assistance is insufficient);
(2) dealing with a new fabrication method such as laser fabrication or superadvanced fabrication is impossible (only cutting is available, numerical value accuracy is insufficient); and
(3) a fabrication method itself cannot be selected (different material characteristics are given in compound material).

To solve the aforementioned problems, the inventors et. al have invented "METHOD FOR STORING SUBSTANTIAL DATA THAT INTEGRATES SHAPE AND PHYSICAL PROPERTIES", and applied for a patent (Japanese Patent Application No. 2001-25023, not laid-open).

According to this invention, as schematically shown in FIG. 1, external data constituted of boundary data of an object is divided into cubic cells by oct-tree division in which boundary surfaces cross each other, and the cells are classified into a nonboundary cell 13a which includes no boundary surface and a boundary cell 13b which includes a boundary surface. In the drawing, a reference numeral 15 is a cutting point.

According to this invention, various physical property values are stored for each cell, and substantial data that integrates shapes and physical properties can be stored by a small storage capacity. Thus, a shape, a structure, physical property information, and hysteresis are managed in a unified manner to enable management of data regarding a series of processes from designing to fabricating, assembling, testing, evaluation and the like based on the same data, whereby it is possible to unify CAD and simulation.

The aforementioned method for storing the substantial data is referred to as "volume CAD" or "V-CAD" hereinafter. In the present application, the V-CAD is defined as follows: "V-CAD means that a boundary surface is formed in a cell of a voxel dataset".

According to conventional CAD, even a solid is in fact hollow papier-mache stage data as in the case of the B-rep or the like. On the other hand, according to the V-CAD, even the inside is stuffed, and physical data can be held. Because of internal information that has been provided, it is expected that geometrical calculation which tends to break down in shape processing of the B-rep or the like can be strongly carried out. Further, the V-CAD goes beyond a framework of a simple tool to represent shapes, and is designed to provide a data foundation which can be directly used for simulation and fabrication. In order to truly achieve a system of such "manufacturing", a simulation technology or a fabrication technology must be simultaneously developed to effectively use the V-CAD. Especially, for fabrication, only data of a surface shape has been used. Therefore, it can be said that there are almost no fabrication technologies capable of truly utilizing volume data except laser stereolithography and rapid prototyping (3D ink jet).

From the viewpoint of the current situation of a manufacturing world, it is very important to generate volume data in the V-CAD by reading a shape represented by the conventional type CAD. Thus, according to the V-CAD, it is necessary to possess boundary data which enables reconstruction of a boundary of shape data (external data) in a boundary cell.

Conventionally, it is marching cubes (abbreviated to MC hereinafter) that have generally been used for generating a polygon from volume data. For example, the MC is introduced in the following Document 1:

(Document 1) "MARCHING CUBES: A HIGH RESOLUTION 3D SURFACE CONSTRUCTION ALGORITHM", Computer Graphics, Volume 21, Number 4, July 1987.

For reference, FIGS. 2a to 2d show all cutting point patterns and boundary segments of two-dimensional MC, and FIGS. 3a to 3n show all cutting point patterns (boundary surfaces are omitted) of three-dimensional MC.

In the case of the three-dimensional MC, positive and negative numerical values are written in 8 vertexes of a three-dimensional cell (cube), and isosurfaces are generated based on these numerical values (isosurfaces of zero values are considered hereinafter). One cutting point is disposed on an edge if signs (positive or negative) of numerical values of both ends of the edge of the cube do not match each other. No cutting point is disposed if they match each other. This operation is carried out for 12 edges of the cube, and then planes are formed based on cutting points. The same holds true for the two-dimensional MC.

FIGS. 4a to 4c are exemplary views showing a difference of cutting points in rectangular cells between MC and Kitta cubes (KTC). In the examples, in the case of the MC, 4 vertexes (white circles) of a square cell have the same sign as they are located outside a shape (closed curve) in a situation as shown in FIG. 4a, and thus no cutting points are generated on 4 edges (4 sides) of the cell. As a result, no approximate isosurfaces are formed at all in this case. This means that current resolution is too rough to represent the shape from the standpoint of the MC. Therefore, in the MC of the example, there is a problem of impossibility of representing the cutting points of the 4 edges of the cell as in the case of FIG. 4b or 4c. FIG. 4a shows an extreme example. Essentially similar defects frequently occur, and FIG. 4d shows an defect example. Such defects frequently occur at an intersection of a curved boundary surface and a cell edge. In the case of the KTC, this situation is approximated as shown in FIG. 4f. In the case of the MC, it is approximated as shown in FIG. 4g. FIGS. 4c and 4f show two-dimensional examples. In three-dimensional representation, more cases can be represented only by the KTC. It can be understood that the KTC has much richer power of representation than the MC at equal resolution.

On the other hand, according to the present invention (KTC) described later, two cutting points are generated on each of 4 edges as shown in FIG. 4b. If the number of cutting points is limited to 0 or 1 on one edge, representation as shown in FIG. 4c can be obtained.

FIGS. 5a and 5b are views showing a difference of cutting points on edges between the conventional MC and the KTC of the present invention. When the MC is constructed, the number of cutting points is limited to 0 or 1 on one edge. As illustrated in FIG. 5a, in the case of the MC, one cutting point is generated on an edge only when signs of both ends of each edge of a cell oppose each other (positive and negative values). Thus, as shown in FIG. 5b, when a cutting point is given on one edge, signs of both edges may not only oppose each other (positive and negative values) but also match each other. In the case of the MC, a cutting point can be represented only in a part of such cases.

In FIGS. 4a to 4c, in the case of the MC, the cell must be subdivided to represent a shape indicated by a closed solid line. As a result, in the V-CAD that uses the MC, subdivision of the cell becomes necessary to hold boundary data, and a storage capacity to store substantial data that integrates the shape and physical properties is accordingly increased exponentially. Furthermore, prevention of an increase in the storage capacity causes a difficulty of precisely representing a shape of a boundary part.

SUMMARY OF THE INVENTION

The present invention has been made to solve the foregoing problems. That is, objects of the invention are to provide a method and a program for converting boundary data into cell inner shape data, which can include all cell edge cutting points obtained by marching cubes (MC), and all cell edge cutting points unobtainable by the MC without omission, and thereby include cell inner shape data constituted of boundaries that connect the cell edge cutting points without omission.

According to the present invention, there are provided a method and a program for converting boundary data into cell inner shape data, characterized by comprising: a division step (A) of dividing external data (12) constituted of boundary data of an object into cells (13) in an orthogonal grid; a cutting point deciding step (B) of deciding an intersection point of the boundary data and a cell edge as a cell edge cutting point; a boundary deciding step (C) of deciding a boundary connecting formed by the cell edge cutting points as the cell inner shape data; a cell classification step (D) of classifying the divided cells into a nonboundary cell (13a) including no boundary surface and a boundary cell (13b) including a boundary surface; and a boundary cell data classification step (E) of classifying cell data constituting the boundary cell into internal cell data inside the cell inner shape data and external cell data outside the cell inner shape data.

According to the method and the program, by the division step (A) and the cell classification step (D), it is possible to store the external data (12) of the object as a cell hierarchy in which the external cell (12) is divided into the cells (13) in an orthogonal grid by a small storage capacity.

In the cutting point deciding step (B), the intersection point of the boundary data and the cell edge is decided as the cell edge cutting point. Thus, it is possible to include arrangement of all cutting points by an MC in which "one cutting point is disposed on an edge if signs of numerical values of both ends of the cell edge are different from each other, and no cutting point is disposed if signs of the numerical values are equal to each other", and to include all other arrangements of cutting points on boundary surfaces and cell edge lines without omission under a condition that the number of cutting points on one edge is at most one.

Further, in the boundary deciding step (C), the boundary formed by connecting the obtained cell edge cutting points is decided as the cell inner shape data. Thus, it is possible to include all cell inner shape patterns by the MC, and to include other cell inner shape patterns without omission under the condition that the number of cutting points on one edge is at most one.

Additionally, in the boundary cell data classification step (E), the cell data constituting the boundary cell are classified into the internal cell data inside the cell inner shape data and the external cell data outside the cell inner shape data. Thus, it is possible to classify all the cell data into nonboundary and boundary cell data while maintaining continuity from adjacent cells.

According to a preferred embodiment of the invention, the cells are quadrangular cells including square and rectangular cells in two-dimensional representation, and in the cutting point deciding step (B), intersection points of boundary data and cell edges that have totally $2^4=16$ arrangement cases (patterns or sorts) are decided as the cell edge cutting points, and the arrangement cases that become equivalence classes by rotational operation are decided as identical patterns on the assumption that the quadrangular cells are square cells so that the $2^4=16$ arrangement cases are further classified into 6 patterns.

By this method, in the case of the two-dimensional cell, it is possible to classify patterns of cell edge cutting points into 6 patterns including 4 patterns by the MC, and to include all cell edge cutting points possible without omission under the condition that the number of cutting points on one edge is at most one.

In the boundary deciding step (C), arrangement of a cutting segment (=boundary line formed by connecting cell edge cutting points) is decided as the cell inner shape data for all the 6 patterns.

Additionally, in the boundary deciding step (C), cell inner shape data patterns that become equivalence classes by three-dimensional rotational operation are decided as identical patterns so that the cell inner shape data patterns are classified into 22 patterns.

By these methods, it is possible to include all cell inner shape data by the MC, and cell inner shape data possible under the condition that the number of cutting points on one edge is at most one, without omission.

According to another preferred embodiment of the invention, the cells are hexahedron cells including cubic and rectangular parallelepiped cells, and in the cutting point deciding step (B), intersection points of boundary data and cell edges that have totally $2^{12}=4096$ arrangement cases are decided as the cell edge cutting points, and the arrangement cases that become equivalence classes by rotational operation and mirroring operation are decided as identical patterns so that the $2^{12}=4096$ arrangement cases are further classified into 144 patterns.

By this method, in the case of the three-dimensional cell, it is possible to classify patterns of cell edge cutting points into 144 patterns including 14 patterns by the MC, and to include all other patterns of cell edge cutting points possible under the condition that the number of cutting points on one edge is at most one, without omission.

In the cutting point deciding step (B), the cell edge cutting point patterns that become equivalence classes by an inversion operation regarding presence/nonpresence of cutting points are decided as identical patterns so that the cell edge cutting point patterns are classified into 87 patterns in which the number of the cell edge cutting points is 0 to 6.

By this method, it is possible to reproduce all the 144 patterns of the cell edge cutting points without omission by the 87 patterns in which the number of cell edge cutting points is 0 to 6.

In the boundary deciding step (C), a boundary surface formed by connecting the cell edge cutting points is decided as the cell inner shape data for all the patterns.

By this method, it is possible to include all the cell inner shape data by the MC, and all other cell inner shape data possible under the condition that the number of cutting points on one edge is at most one, without omission.

Other objects and advantageous features of the present invention will become apparent upon reading of the following description with reference to the accompanying drawings.

BRIEF DESCRIPTION OF THE DRAWINGS

FIGS. 3a to 3n are views showing all equivalence classes of cutting point arrangement of 3D-MC;

FIG. 7a to 7f are views showing all equivalence classes of cutting point arrangement in 2D-KTC;

FIGS. 8a to 8v are views showing all equivalence classes of cutting segment arrangement in the 2D-KTC of FIGS. 7a to 7f;

FIG. 15 is a view showing an example in which no cell division is made even if a closed loop is established;

FIGS. 16a to 16c are views showing examples in which 2- or 3-division of cells can be made depending on a way of triangular division which uses a closed loop as an edge even if the closed loop is formed;

FIG. 16d is a view showing a three-dimensional version of FIG. 4f;

FIGS. 18a to 8c are views showing 14 triangular divisions obtained from Catalan number by assuming a closed loop formed by connecting cutting points as a regular hexagon when the closed loop is a hexagon in 3 equivalence classes.

DESCRIPTION OF THE PREFERRED EMBODIMENTS

Next, the preferred embodiments of the present invention will be described with reference to the accompanying drawings.

Figure 6:
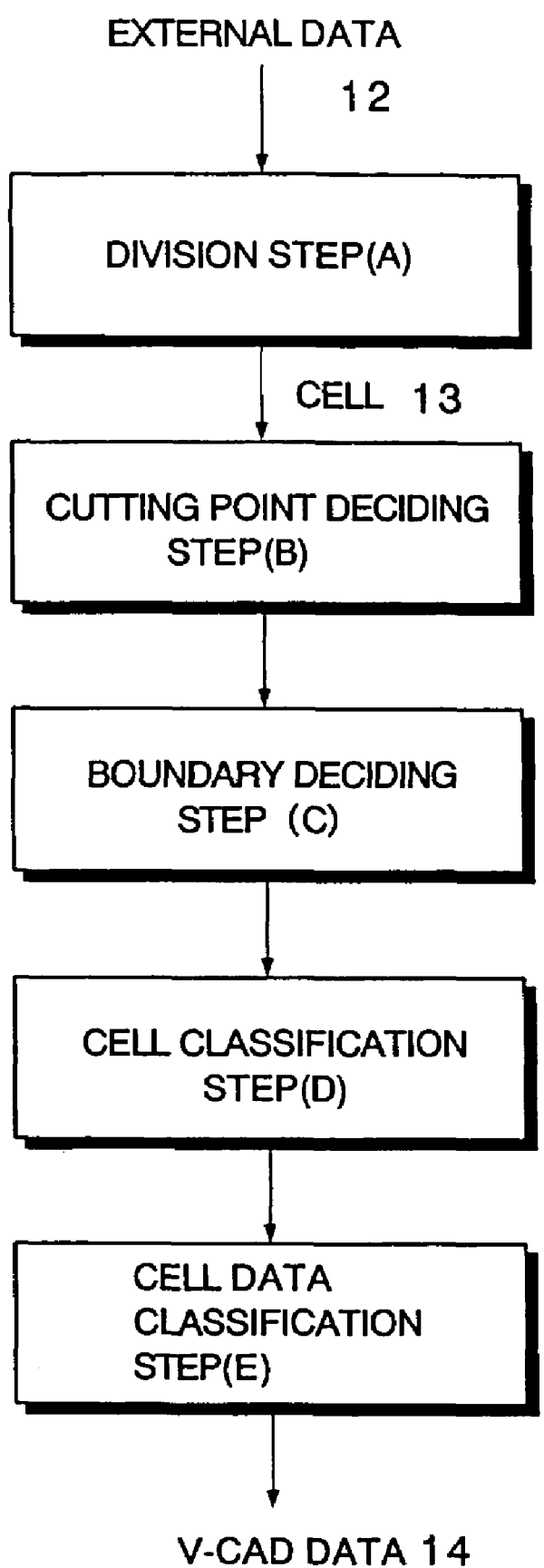
FIG. 6 is a flowchart showing a method and a program for converting data according to the present invention.

FIG. 6 is a flowchart of a method and a program for converting data according to the present invention. As shown, each of the method and the program of the invention comprises a division step (A), a cutting point deciding step (B), a boundary deciding step (C), a cell classification step (D), and a boundary cell data classification step (E).

External data 12 input from the outside is polygon data indicating a polyhedron, a tetrahedron or hexahedron element used for a finite element method, curved surface data used for three-dimensional CAD or a CG tool, or data in which the other solid surface is represented by information containing a partial plane or curved surface.

In addition to such data (referred to as S-CAD data), the external data 12 may be (1) data directly prepared by a human input through a boundary surface of V-CAD's own (V-boundary surface), (2) surface digitized data of a measuring device, a sensor, a digitizer or the like, and (3) volume data containing internal information such as voxel data for CT scanning, MRI, and generally used for volume rendering.

In the division step (A), the external data 12 constituted of boundary data of an object obtained in an external data acquisition step (not shown) is divided into cells 13 of an orthogonal grid.

In the case of a two-dimensional cell, the data is divided into rectangular cells by quad-tree division.

In the case of a three-dimensional cell, the data is divided into rectangular parallelepiped cells 13 by oct-tree division. In oct-tree representation, i.e., oct-tree space division, a reference rectangular parallelepiped 13 including a target solid (object) is divided into 8 parts, and 8-division processing is recursively repeated to a specified cell size until no more boundary surfaces are included in each region. By this oct-tree division, it is possible to reduce an amount of data more greatly than that in voxel representation.

In the quad-tree representation, one space region obtained by oct-tree space division is called a cell 13. The cell is rectangular or rectangular parallelepiped. The rectangle or rectangular parallelepiped is a square or a cube in a special case, but more generally it may be a quadrangle or a hexahedron in which edges do not cross each other at a right angle. A region occupying a space is represented by a hierarchical structure, the number of divisions or resolution of the cell. Accordingly, the object is represented by stacking cells different from one another in size in the entire space.

In the cutting point deciding step (B), an intersection point of boundary data and a cell edge is decided as a cell edge cutting point 15.

In the case of the two-dimensional cell, in the cutting point deciding step (B), intersection point patterns $2^4=16$ of boundary data and cell edges are set as cell edge cutting point arrangement, and intersection point patterns (arrangement cases or sorts) that become equivalence classes by rotational operation are decided as identical patterns so that the totally $2^4=16$ arrangement cases are further classified into 6 patterns.

In the case of the three-dimensional cell, in the cutting point deciding step (B), intersection point patterns $2^{12}=4096$ of boundary data and cell edges are set as a cell edge cutting point arrangement, and the intersection point patterns (the arrangement cases) that become equivalence classes by rotational operation and mirroring operation are decided as identical patterns so that the totally $2^{12}=4096$ arrangement cases are further classified into 144 patterns. In the case of the three-dimensional cell, since there are many patterns, it is further possible to reproduce 144 patterns of 7 to 12 cutting points from 87 patterns of 0 to 6 cell edge cutting points by deciding as identical patterns the intersection point patterns that become equivalence classes by an inversion operation regarding presence/nonpresence of cutting points.

In the boundary deciding step (C), a boundary formed by connecting the obtained cell edge cutting points is decided as the cell inner shape data.

In the case of the two-dimensional cell, in the boundary deciding step (C), cutting segment arrangement made by connecting the cell edge cutting points is decided as the cell inner shape data for all the 6 patterns of the cell edge cutting points. More specifically, it is advised to classify the cell inner shape data into 22 kinds of cell inner shape patterns (described later) by deciding as identical patterns the cell inner shape data that become equivalence classes by a three-dimensional rotational operation.

In the case of the three-dimensional cell, in the boundary deciding step (C), an approximate boundary surface (=cut triangle arrangement) made by connecting the cell edge cutting points is decided as the cell inner shape data for all the patterns of the cell edge cutting points. Incidentally, in a later-described specific example, acquisition of the approximate boundary surface made by connecting the cell edge cutting points may be referred to as "plane formation".

In the cell classification step (D), the cells obtained by the division are classified into a nonboundary cell 13a including no boundary surface and a boundary cell 13b including a boundary surface.

That is, according to the invention, quad-tree or oct-tree division is used to represent the boundary cell 13b, a cell completely included inside is decided as an internal cell 13a having a largest size, and a cell including boundary information from the external data 12 is decided as a boundary cell 13b.

In the boundary cell data classification step (E), cell data constituting a boundary cell are classified into internal cell data and external cell data. The internal cell data is inside the cell inner shape data, and the external cell data is outside the cell inner shape data.

According to the method of the invention, the steps (A) to (E) are repeated when necessary. Additionally, for example, simulations of designing, analyzing, fabricating, assembling, testing and the like are sequentially carried out by using the obtained V-CAD data 14, and the result is output as CAM or polygon data, for example at an output step.

The conversion program of the invention is a computer program for executing the aforementioned steps (A) to (E), and incorporated in a computer to be used.

Next, the present invention will be described more in detail.

1. The invention provides a novel method for generating a cell inner surface. This completely includes cell inner surface patterns of a marching cube method, and is a more general method.

According to the invention, when a shape such as a polygon is read into a voxel aggregation to generate volume data, an intersection point of a cell edge and a shape surface which is a sampling point is recorded as a cutting point, and the shape surface is restored based on such cutting point information.

According to the invention, to begin with, cell inner surface generation patterns from the cutting points are completely defined in two-dimensional representation. That is, enumeration (6 patterns) of equivalence classes of cutting point arrangement is performed, and all possibilities (22 patterns) of cell inner surface formation are collected for all arrangement of cutting points.

For three-dimensional representation, equivalence classes are enumerated (144 patterns) for the cutting point arrangement according to the invention. Regarding three-dimensional cell inner surface generation, cutting points can be connected on 6 surfaces of a cube by line segments without intersection for more than half of all the arranged cutting points. If such a closed loop is constructed, it is possible to relatively easily form a cell inner surface in which the loop is an outer edge. As a result of the enumeration, arrangement of cutting points which has one closed loop passing through all the cutting points once corresponds to 87 patterns among the 144 patterns. An example of a cell inner surface formed by using a closed loop will be described later.

1.1 It is a theme of the invention that a surface shape of conventional type CAD is read into a cell space, an intersection point (cutting point) of a surface and a cell edge is recorded, and the original surface shape is accordingly approximated to a triangular surface.

1.2 Marching Cubes (MC)

In the case of the aforementioned marching cubes (abbreviated to MC), positive and negative numerical values are written in 8 vertexes of the cell, and isosurfaces are generated based on the positive and negative numerical values (isosurfaces of zero values are considered hereinafter). If signs (positive or negative) of the numerical values of both ends of an edge of a cube are different from each other, one cutting point is disposed on the edge. No cutting point is disposed if signs of the numerical values are equal to each other. This operation is carried out for 12 edges of the cube, and then a surface is formed based on the cutting points.

The MC has come into wide use since the surface is strongly formed by a simple algorithm. Contents of the MC can be summarized as the following two: (1) pattern classification of cutting point arrangement, and (2) definition of formation of a cell inner surface for each cutting point arrangement (i.e., how to connect cutting points). A problem of ambiguity of the MC is that formation of a cell inner surface of (2) is not always unique. However, it is not difficult to specify unique formation of a surface. For example, if ambiguity arises, it is advised to decide formation of a cell inner surface to interconnect vertexes of large values, or vertexes of small values. The strong MC means that the cell inner surface can be formed without holes by such decision, i.e., a triangular edge constituting the cell inner surface is shared by 2 triangles.

1.3 Kitta Cubes (KTC)

The invention provides novel broad-sense means for approximating a surface shape by a cut triangle in which a cutting point is a vertex, which is referred to as Kitta cubes (abbreviated to KTC hereinafter) (Kitta is a Japanese word meaning "cut").

In the case of the aforementioned MC, the cell inner surface is strongly formed. However, it does not necessarily mean that the shape is correctly represented. The invention makes it apparent that when the shape is represented at equal resolution (=equal cell sizes), it can be represented more accurately by using the KTC than by using the MC.

Figure 1:
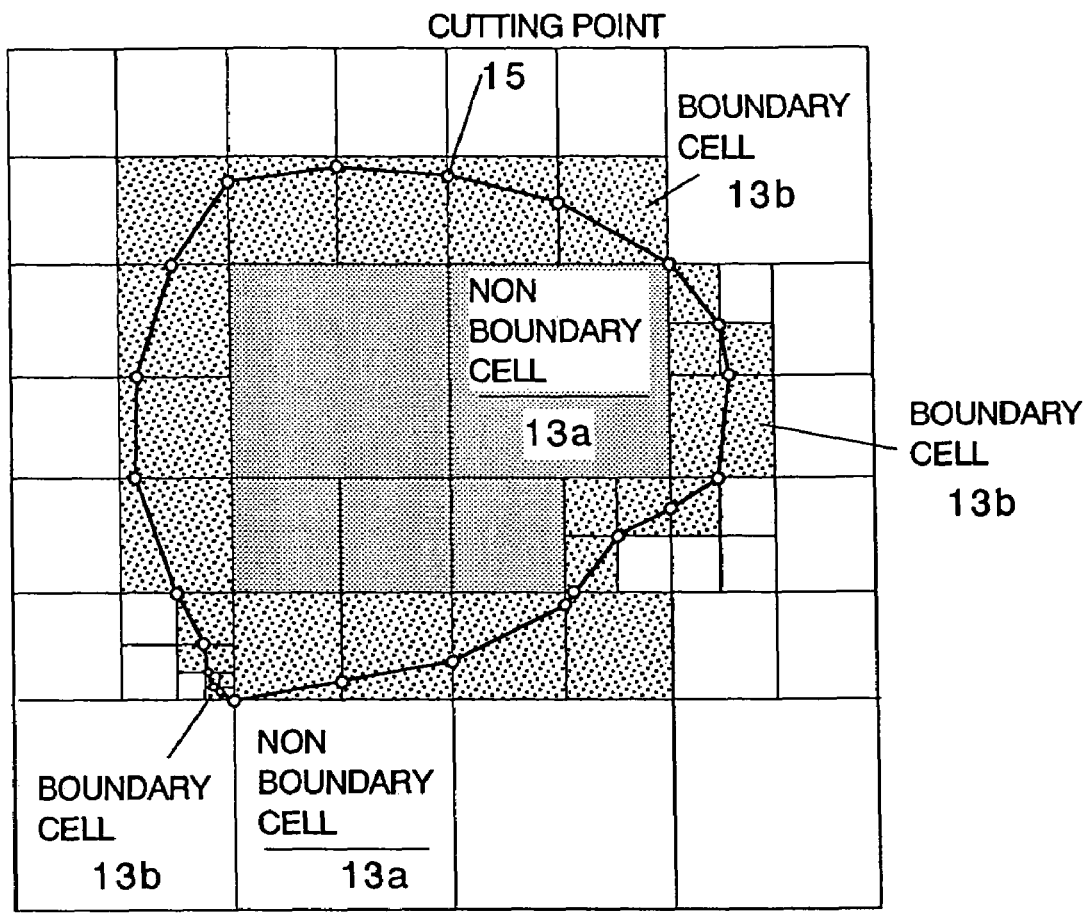
FIG. 1 is a principle view of V-CAD.
Figure 2A:
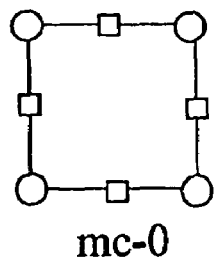
FIGS. 2a to 2d are views showing four kinds of equivalence classes of 2D-MC.
Figure 2B:
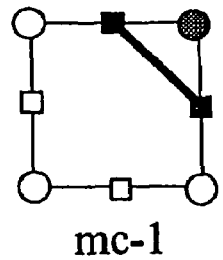
Figure 2C:
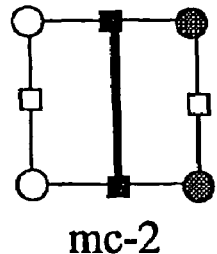
Figure 2D:
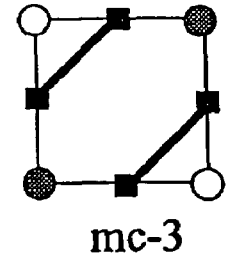
Figure 4A:
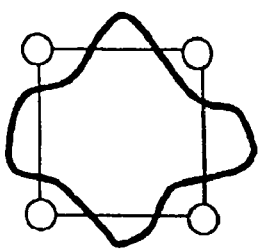
FIGS. 4a to 4f are views of typical examples of KTC.
Figure 4B:
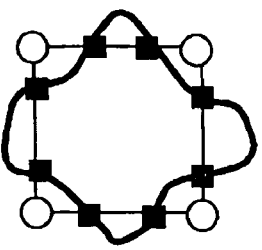
Figure 4C:
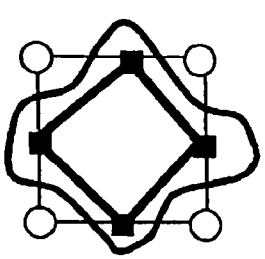

Before describing accurate definition of the KTC, a two-dimensional typical example showing that the KTC can represent the shape more accurately than the MC is given (each of FIGS. 4a to 4c). In the case of the aforementioned MC, in a situation as shown in FIG. 4a, 4 vertexes of a square cell have the same sign as they are located outside the shape, and thus no cutting points are disposed on 4 edges of the cell. As a result, no cell inner surface is formed at all in the case of FIG. 4a. From the standpoint of the MC, this means that current resolution is too rough to represent the shape.

Figure 4D:
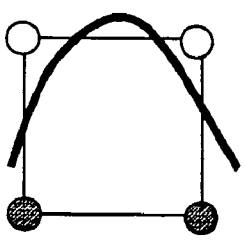
Figure 4E:
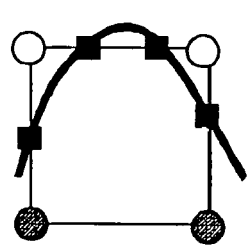
Figure 4F:
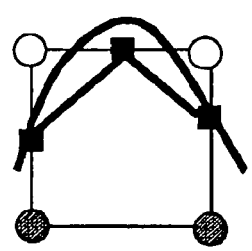
Figure 4G:
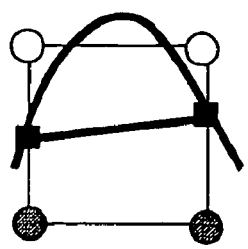
FIG. 4g is a view showing representation of FIG. 4f in MC.

Next, the KTC is applied at equal resolution. Cutting points as shown in FIG. 4b are recorded by cutting point checking. If the number of cutting points on one edge is up to one, and two cutting points of FIG. 4b are integrated into one in a proper position, a cell inner surface as shown in FIG. 4c is formed at the end. A difference in power of representation between the two is apparent. FIG. 4a shows an extreme example. However, essentially similar defects frequently occur, and FIG. 4d shows such an example. The defects frequently occur at an intersection of a curved boundary surface and a cell edge. In the case of the KTC, this situation is approximated to that of FIG. 4f. In the case of the MC, it is approximated to that of FIG. 4g. FIGS. 4c and 4f show two-dimensional examples. In three-dimensional representation, more cases can be represented only by the KTC. It can be understood that the KTC is much higher in power of representation than the MC at equal resolution.

In fact, if algorithm frameworks are compared between the KTC and the MC, the KTC completely includes the MC (described later). That is, MC patterns constitute a partial aggregation of KTC patterns. In this sense, it is only natural that the KTC is higher in power of representation than the MC.

Figure 5A:
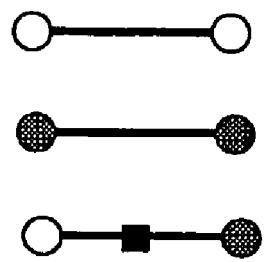
FIGS. 5a and 5b are views showing a difference of cutting points on cell edges between MC and KTC.
Figure 5B:
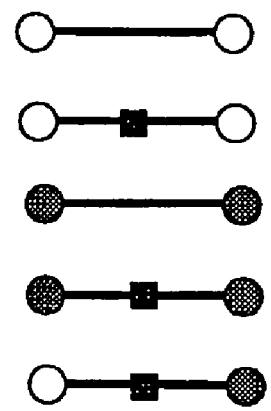

In each of FIGS. 4a to 4c, the number of cutting points on one edge is limited to one. However, to understand the frameworks of the MC and the KTC, it is important to recognize that this limitation has an apparent difference in specific meaning. In MC construction, the number of cutting points is limited to 0 or 1. According to the invention, the KTC is constructed within a framework in which the number of cutting points is 0 or 1 on one edge. A difference between the two is that one cutting point is disposed on one edge only when signs of both ends of each edge of the cell oppose each other (positive and negative) (FIG. 5a) in the case of the MC, while a cutting point is disposed on one edge not only when signs of both ends thereof oppose each other (positive and negative) but also when signs of the both ends thereof are equal to each other in the case of the KTC (FIG. 5b).

Hereinafter, the case of the MC is referred to as "narrow-sense condition that the number of cutting points on one edge is at most one", and the case of the KTC is referred to as "broad-sense condition that the number of cutting points on one edge is at most one" to clearly distinguish them from each other. As apparent from FIGS. 5a and 5b, the broad-sense condition that the number of cutting points on one edge is at most one completely include the narrow-sense condition that the number of cutting points on one edge is at most one. Thus, regarding patterns of two-dimensional and three-dimensional cutting point arrangements provided by both, all the MC patterns constitute a partial aggregation of all the KTC patterns.

2. Two-dimensional Kitta cubes KTC (2D-KTC) is constructed in two-dimensional representation.

2. 1 Classification of Cutting Point Arrangement in 2D-KTC

The 2D-KTC is constructed at 2 stages. The first stage is classification of cutting point arrangement for 4 edges of a square. The second stage is classification of cutting segment (=segment having cutting points in both ends thereof) arrangement for each cutting point arrangement.

FIGS. 7a to 7f show all the patterns of the cutting point arrangement in the 2D-KTC. There are $2^4$32 16 patterns because of two possibilities of presence and nonpresence of cutting points for each of the 4 edges. These are integrated into 6 patterns of Table 1 and FIGS. 7a to 7f if equivalence classes are enumerated for a rotational operation. In the drawings, circled squares are present in the 2D-MC.

If an inversion operation regarding presence/nonpresence of cutting points is added to classification of equivalence classes, the 6 patterns are integrated into 4 patterns. However, in cutting segment arrangement of the section 2. 2, all the 6 patterns must be defined.

TABLE 1

| | Number of cutting points: | | |
|---|---|---|---|
| | 1, 3 | 2 | Total(K = 0-4) |
| Total number of cutting point arrangements: [4k] | 4 | 6 | 16 |
| Number of equivalence classes | 1 | 2 | 6 (4) |
| Index in FIGS. 7a to 7f | FIG. 7a, FIG. 7f | FIG. 7b, FIG. 7e | FIG. 7a, FIG. 7f | — |

In appendices A, B (described later), 2D and 3D MC are described. In the MC, black and white inversion of black and white coloring of vertexes (corresponding to distinction between positive and negative values of the vertexes) is permitted in classification. It is because of no change in cutting point arrangement before and after black and white inversion.

Degrees of reduction for the arrangements in FIGS. 7a to 7f are 1, 4, 4, 2, 4, 1 in order (16 if added together). Here, the "degree of reduction" means the number of arrangements integrated into one equivalence class by a rotational operation.

2. 2. Cutting Segment Arrangement in 2D-KTC

The process proceeds to the second stage of the 2D-KTC. Here, all the possibilities of cutting segment arrangements are collected for each of the 6 kinds of cutting point arrangements obtained in the section 2. 1. In the collection, when cutting segments are arranged in a target cell, it is not necessary to use all the cutting points present on the edge of the cell". One edge is shared by two cells. If there is one cutting point on the edge, even when the edge is not used in one cell to form a cell inner line, there is a possibility that it will be used in the other cell.

Needless to say, there is a possibility that the edge will be used in neither of the cells. It is when a very small shape intersects only one edge. An attitude of utilizing cutting point information is to place a very small segment on the edge, and the other attitude is not to use the cutting points for line setting at all. However, since the placing of the segment (placing of surface part in 3 dimensional representation) means that a shape surface becomes other than a manifold, it is not described in this specification. For the same reason, a case in which cutting segments intersect each other in a cell or branched (=three cutting segments intersect one another on the same cell edge) is excluded from enumeration.

FIGS. 8a to 8v show all arrangements of cutting segments in the 2D-KTC, which are results of investigating all possibilities of line setting for each of the 6 kinds of cutting point arrangement obtained in the section 2. 1. In the drawings, circled squares are present in the 2D-MC. These apparently constitute only a partial aggregation of the 2D-KTC.

A three-dimensional rotational operation is used when equivalence classes are counted. Assuming that connection of cutting segments have no diversity, i.e., intersections or branches, it is possible to differently color 4 vertexes of FIGS. 8a to 8v black and white. Different from the case of the MC, the different coloring is executed after arrangement of the cutting segments. Paying attention to cutting segment arrangement patters of FIGS. 8a to 8v, similar types emerge as in the case of, e.g., 2A(1), 3(5), 4(9). However, they cannot be omitted for the purpose of including ways of surface formation for all the cutting point arrangements. Incidentally, there are 10 cases if 22 kinds of patterns drawn in FIGS. 8a to 8v are classified by cutting segment arrangement.

3. Three-dimensional Kitta Cubes (3D-KTC)

3. 1 Classification of Cutting Point Arrangement in 3D-KTC

It is made clear how many equivalence classes totally $2^{12}$=4096 cut edge arrangements are integrated into and how they are arranged when only a rotational operation and a mirroring operation are permitted.

To begin with, since equations (1) and (2) of an [expression 1] are established, it can be understood that an inversion operation regarding presence of cutting points in arrangement in which the number of cutting points is 0 to 5 is carried out to obtain arrangement in which the number of cutting points is 7 to 12, and correspondence is set for equivalence classes by the inversion operation.

[Expression 1]

$$2^{12} = \sum_{k=0}^{12} \binom{12}{k} \quad (1)$$

$$\binom{12}{k} = \binom{12}{12-k} \quad (2)$$

Figure 9:
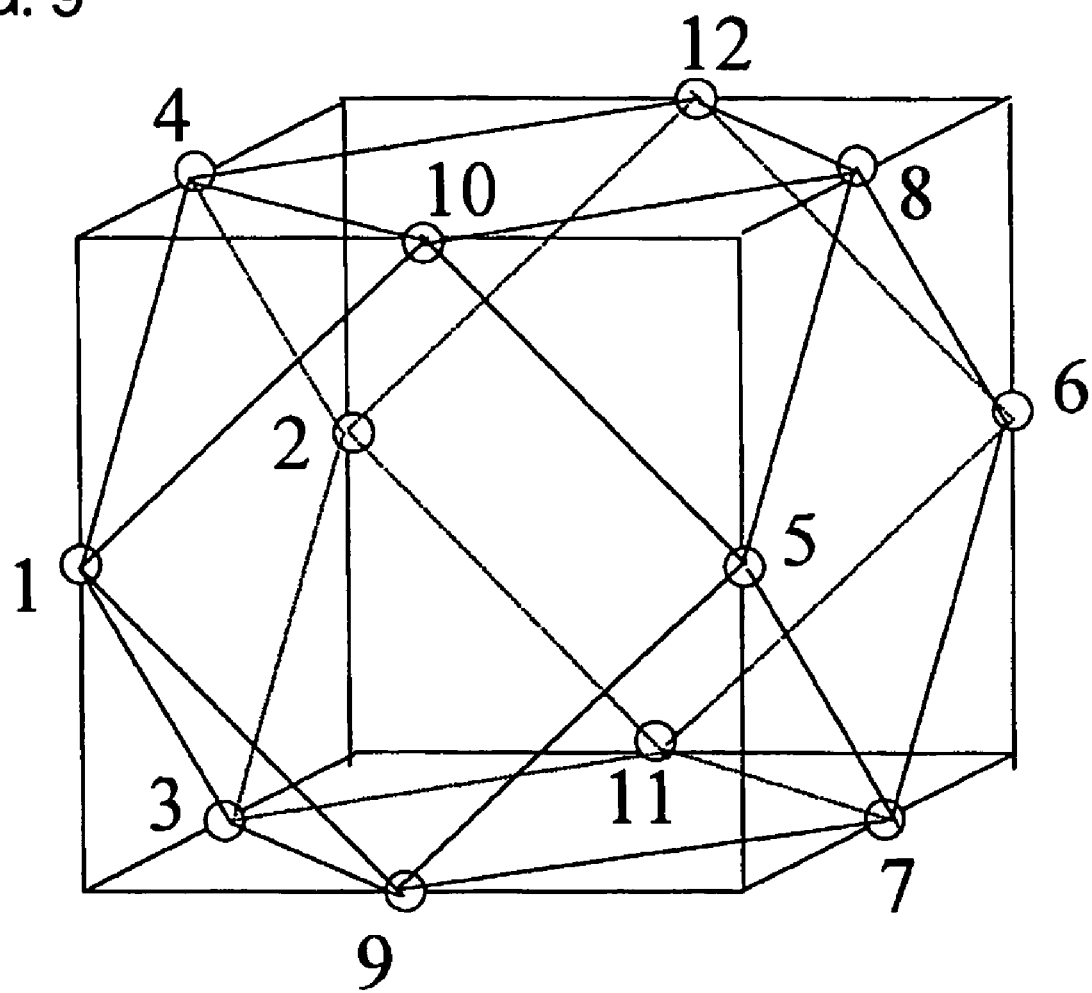
FIG. 9 is a view of a cubic octahedron (one of semiregular polyhedra)

Indexes of 1 to 12 are first given for sides of a cube as shown in FIG. 9. 48 substitution operations are enabled by adding a mirroring operation to 24 rotational operations of a group of regular octahedra. Checking is made on whether the indexes of the 4096 arrangements are new or old one by one in order from the first. In this case, past appearance of the same arrangements can be determined by executing 48 operations for individual arrangements and collating them with the existing list. As shown in Table 2, 144 kinds of cutting point arrangements different from one another can be obtained at the end.

TABLE 2

|  | Number of cutting points: k |  |  |  |  |  |  | Total |
|---|---|---|---|---|---|---|---|---|
|  | 0, 12 | 1, 11 | 2, 10 | 3, 9 | 4, 8 | 5, 7 | 6 | (K = 0-12) |
| Total number of cutting point arrangements [12k] | 1 | 12 | 66 | 220 | 495 | 792 | 924 | 4096 |
| Number of equivalence classes | 1 | 1 | 4 | 9 | 18 | 24 | 30 | 144 (87) |

Figure 10:
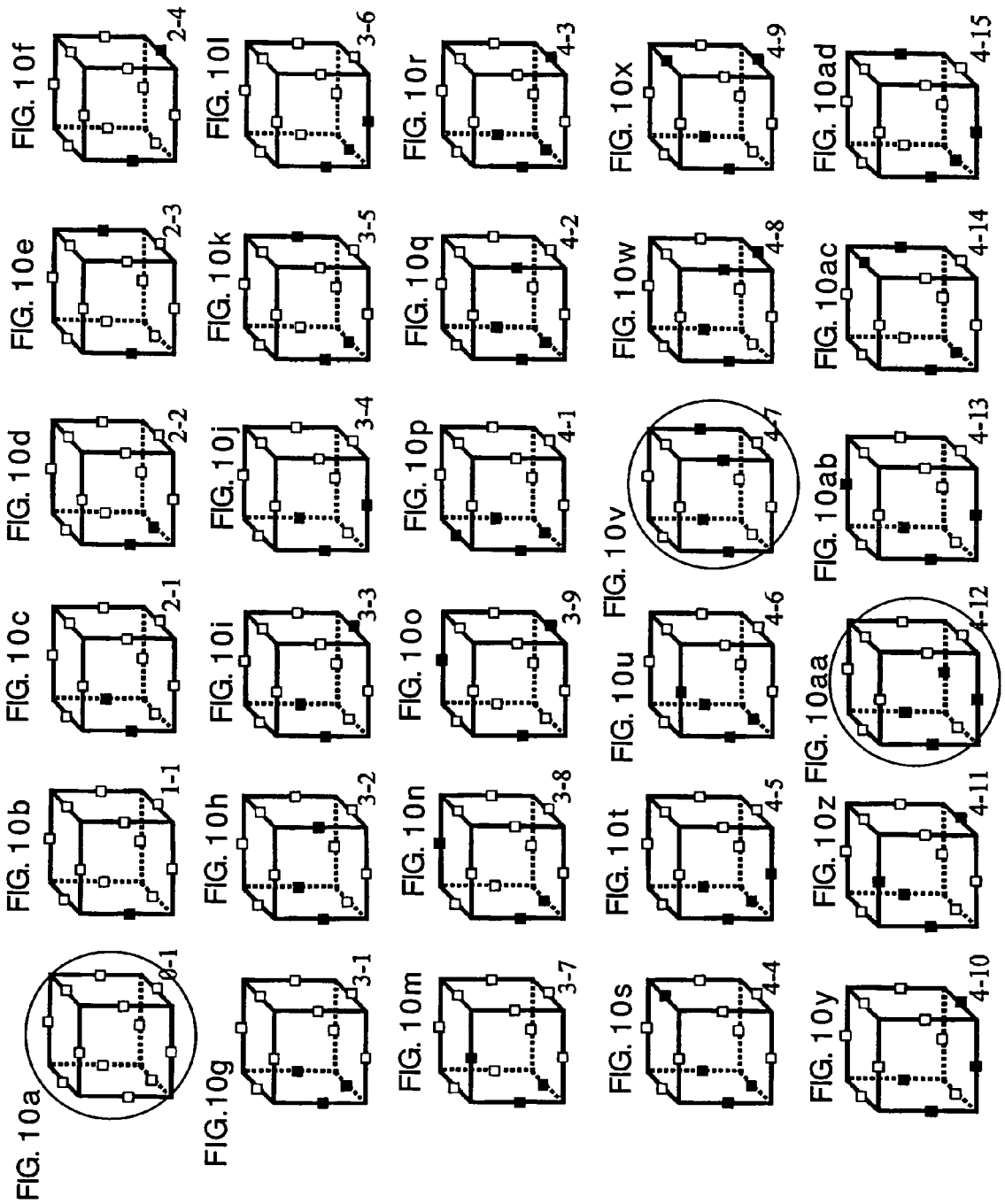
FIGS. 10a to 10ad are views showing thirty equivalence classes when the number of cutting points is 0 to 4 in cutting point arrangement of 3D-KTC.

As described in the previous paragraph, the equivalence classes in which the number of cutting points is 7 to 12 can be reproduced from the equivalence classes in which the number of cutting points is 0 to 5. Thus, totally 87 patterns in which the number of cutting points is 0 to 6 are collected in Table 3, and shown in FIGS. 10a to 10ad, FIGS. 11a to 11aa, and FIGS. 12a to 12ad. Circled cubes are present in the 3D-MC. It can be understood that cutting point arrangement cases of the MC constitute only a part of KTC cutting point arrangement cases. In FIGS. 10a to 10ad, FIGS. 11a to 11aa, and FIGS. 12a to 12ad, a case in which the number of cutting points is 7 to 12 is omitted. However, as in the case of the 2D-KTC, 144 patterns are necessary when arrangement of cut triangles is considered.

TABLE 3

| ♣ |  | 0 cutting point |
|---|---|---|
| 0-1 |  | None |
| ♣ |  | 1 cutting point |
| 1-1 |  | (1) |
| ♣ |  | 2 cutting points |
| 2-1 |  | (1 2) |
| 2-2 |  | (1 3) |
| 2-3 |  | (1 6) |
| 2-4 |  | (1 7) |
| ♣ |  | 3 cutting points |
| 3-1 |  | (1 2 3) |
| 3-2 |  | (1 2 5) |
| 3-3 |  | (1 2 7) |
| 3-4 |  | (1 2 9) |
| 3-5 |  | (1 3 6) |
| 3-6 |  | (1 3 9) |
| 3-7 |  | (1 3 10) |
| 3-8 |  | (1 3 12) |
| 3-9 |  | (1 7 12) |
| ♣ |  | 4 cutting points |
| 4-1 |  | (1 2 3 4) |
| 4-2 |  | (1 2 3 5) |
| 4-3 |  | (1 2 3 7) |
| 4-4 |  | (1 2 3 8) |
| 4-5 |  | (1 2 3 9) |
| 4-6 |  | (1 2 3 10) |

TABLE 3-continued

| 4-7 | (1 2 5 6) |
|---|---|
| 4-8 | (1 2 5 7) |
| 4-9 | (1 2 7 8) |
| 4-10 | (1 2 7 9) |
| 4-11 | (1 2 7 10) |
| 4-12 | (1 2 9 11) |
| 4-13 | (1 2 9 12) |
| 4-14 | (1 3 6 8) |
| 4-15 | (1 3 6 9) |

TABLE 3-continued

| 4-16 | (1 3 6 10) |
|---|---|
| 4-17 | (1 3 6 11) |
| 4-18 | (1 3 6 12) |
| ♣ | 5 cutting points |
| 5-1 | (1 2 3 4 5 10) |
| 5-2 | (1 2 3 4 9) |
| 5-3 | (1 2 3 5 6) |
| 5-4 | (1 2 3 5 7) |
| 5-5 | (1 2 3 5 8) |
| 5-6 | (1 2 3 5 9) |
| 5-7 | (1 2 3 5 10) |
| 5-8 | (1 2 3 5 11) |
| 5-9 | (1 2 3 5 12) |
| 5-10 | (1 2 3 7 8) |
| 5-11 | (1 2 3 7 9) |
| 5-12 | (1 2 3 7 10) |
| 5-13 | (1 2 3 8 9) |
| 5-14 | (1 2 3 8 10) |
| 5-15 | (1 2 3 9 11) |
| 5-16 | (1 2 3 9 12) |
| 5-17 | (1 2 3 10 12) |
| 5-18 | (1 2 5 7 11) |
| 5-19 | (1 2 5 7 12) |
| 5-20 | (1 2 7 8 9) |
| 5-21 | (1 2 7 9 12) |
| 5-22 | (1 2 7 10 12) |
| 5-23 | (1 3 6 8 9) |
| 5-24 | (1 3 6 8 10) |
| ♣ | 6 cutting points |
| 6-1 | (1 2 3 4 5 6) |
| 6-2 | (1 2 3 4 5 7) |
| 6-3 | (1 2 3 4 5 9) |
| 6-4 | (1 2 3 4 5 11) |
| 6-5 | (1 2 3 4 9 10) |
| 6-6 | (1 2 3 4 9 12) |
| 6-7 | (1 2 3 5 6 7) |
| 6-8 | (1 2 3 5 6 8) |
| 6-9 | (1 2 3 5 6 9) |
| 6-10 | (1 2 3 5 6 10) |
| 6-11 | (1 2 3 5 7 8) |
| 6-12 | (1 2 3 5 7 9) |
| 6-13 | (1 2 3 5 7 10) |
| 6-14 | (1 2 3 5 7 11) |
| 6-15 | (1 2 3 5 7 12) |
| 6-16 | (1 2 3 5 8 9) |
| 6-17 | (1 2 3 5 8 10) |
| 6-18 | (1 2 3 5 8 11) |

TABLE 3-continued

| | |
|---|---|
| 6-19 | (1 2 3 5 8 12) |
| 6-20 | (1 2 3 5 11 12) |
| 6-21 | (1 2 3 7 8 10) |
| 6-22 | (1 2 3 7 9 10) |
| 6-23 | (1 2 3 7 9 12) |
| 6-24 | (1 2 3 7 10 12) |
| 6-25 | (1 2 3 8 9 11) |
| 6-26 | (1 2 3 8 9 12) |
| 6-27 | (1 2 3 8 10 12) |
| 6-28 | (1 2 7 8 9 12) |
| 6-29 | (1 3 6 8 9 12) |
| 6-30 | (1 3 6 8 10 11) |

The 144 kinds of arrangements can all emerge as cutting point arrangements when a surface shape is actually read into a cell space. Table 7 of the appendix B shows correspondence of all the cutting point arrangements between the 3D-MC and the 3D-KTC. It can be understood that the MC arrangements constitute only a part of the KTC arrangements.

3. 2 Regarding Definition of Surface Formation in 3D-KTC

Figure 13:
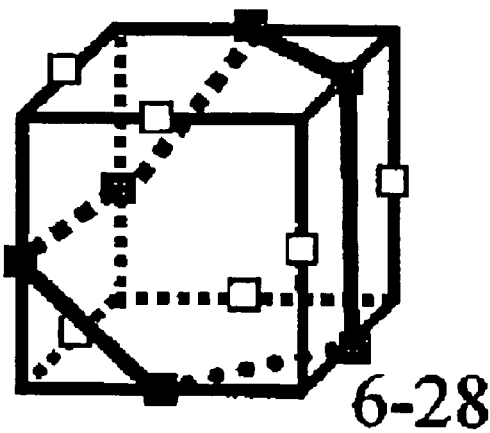
FIG. 13 is a view showing an example in which a line connecting all given cutting points constitutes a closed loop on a surface of a cube.

FIG. 13 shows an example in which segments made by connecting all given cutting points constitutes a closed loop on a surface of a cell. It is a cubic octahedron (one of semiregular polyhedra. 14-hedron constituted of 8 regular triangles and 6 squares) that is shown together with the cell in FIG. 9. Even if a position of a cutting point is a center point of each edge, generality is not lost when cutting point arrangements are counted, or a closed loop is considered. This cubic octahedron is a convex hull for 12 center points on 12 edges. As paths for tracing the closed loop, there are totally 36 paths constituted of two diagonal lines of each square surface of the 14-hedron, i.e., 12 diagonal lines, and 24 edges which the 14-hedron originally has.

Figure 14:
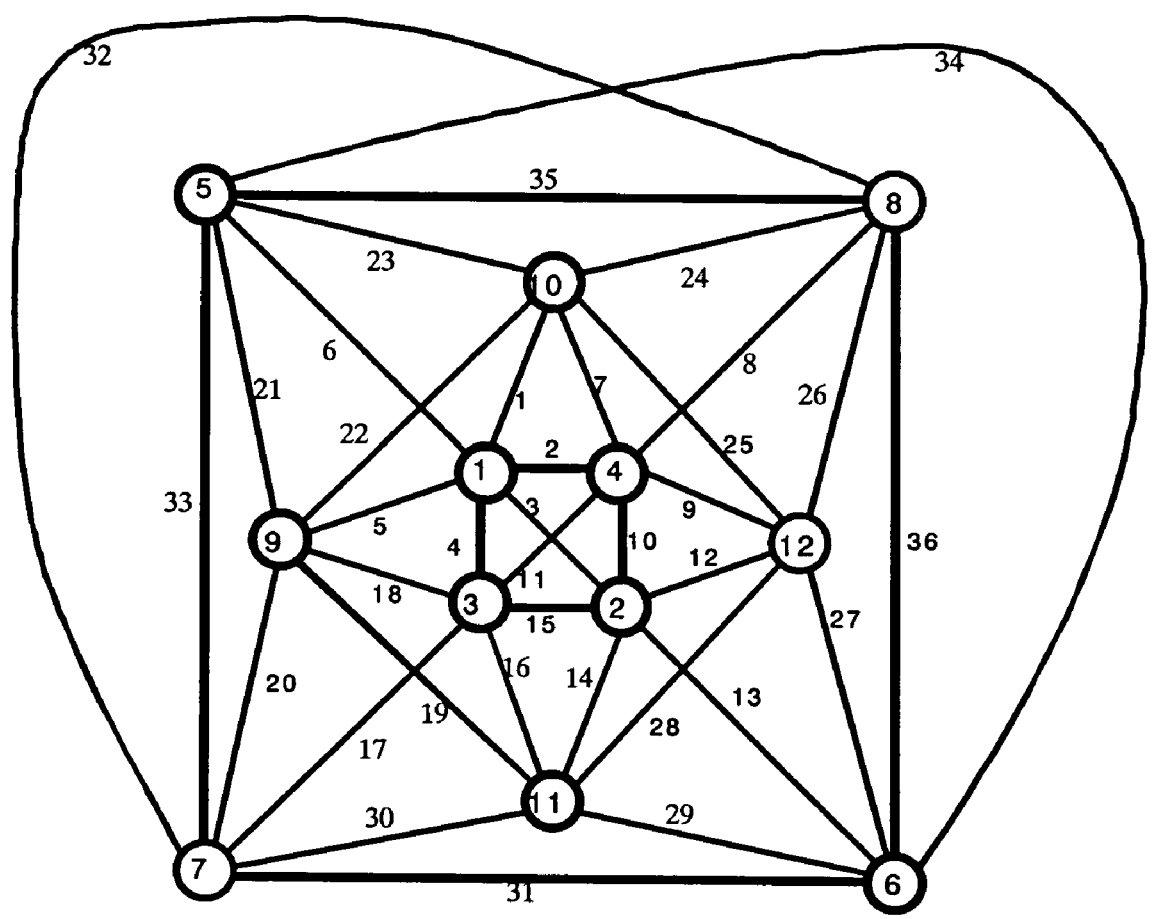
FIG. 14 is a view representing a relation between 12 vertexes and paths of 36 edges of the cubic octahedron of FIG. 9 as a graph on a plane.

FIG. 14 shows a relation between 12 vertexes of the semiregular polyhedron and paths of 36 edges as a graph on a plane. Enumeration of Hamilton closed paths will be described with reference to this drawing. In this graph, the 12 vertexes are all equal at values of 6, and enumeration here needs to be carried out only from one vertex. Paths permitted as Hamilton closed paths are those which pass through all cutting points given on the surface of the cube so as to return to the start point without passing through the same path or cutting point again in the midway. A result of the enumeration is 87 kinds which constitute more than half of the total 144 kinds of the cutting point arrangements, the number of cutting points being 0 to 12 therein, and have non-self-intersection Hamilton paths.

In fact, many of cell inner surfaces formed by such closed loops are suited to V-CAD. The V-CAD has physical information as cell internal information as described above, and multimedia can be dealt with. In this case, a plurality of substances occupy the inside of the cell on a boundary surface of a different material. When the number of substances becomes 3 kinds or more, the number of substances in one cell is preferably limited to two by executing given processing. Many of cell inner surfaces formed by the closed loops are advantageous in that the cell is divided into two.

Figure 17:
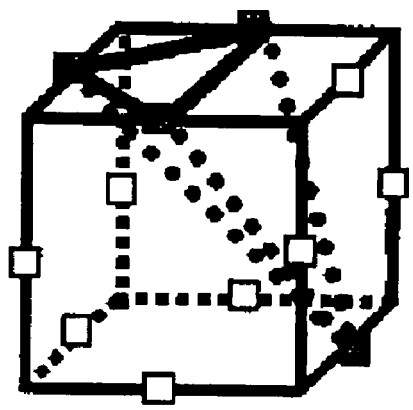
FIG. 17 is a view showing an example in which 2-division of cells is made even if not all cutting points can be connected by one closed loop.

However, all the closed loops do not necessarily divide the cell into two. For example, the cell may not be divided even if a closed loop is formed as shown in FIG. 15. Examples of FIGS. 16a to 16c show that the cell can be divided into two or three depending on a way of triangular division in which the closed loop is set as an edge even if the closed loop is formed. Conversely, the cell may be divided into two even if one closed loop passing through all the cutting points is not formed. FIG. 17 shows such an example.

3. 3 Regarding Triangular Division

If the closed loop is constructed, it is easy in many cases to form a cell inner surface in which the closed loop is set as an edge. A problem of triangularly dividing the cell inner surface has a relation to a problem of triangular division of a polygon on a plane. It is known that the number of triangular division patterns is represented by using Catalan numbers. The Catalan numbers and the triangular division are described later in the appendix C.

3. 4 Example of 3D-KTC

Figure 19B:
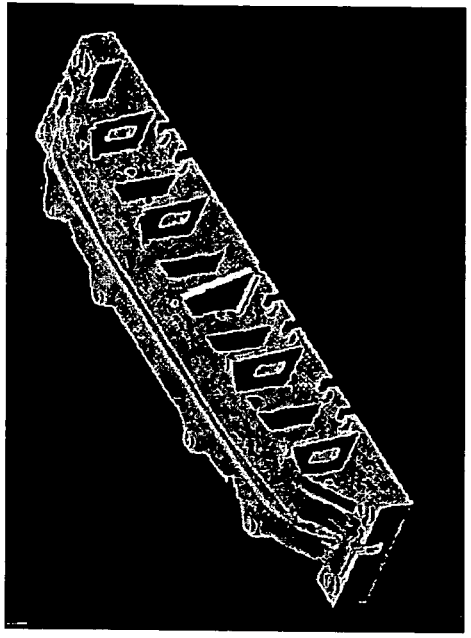
FIGS. 19a to 19d are views showing images on a display which compare B-rep shape representations of a cyclide and a mold with plane formation of KTC.
Figure 19D:
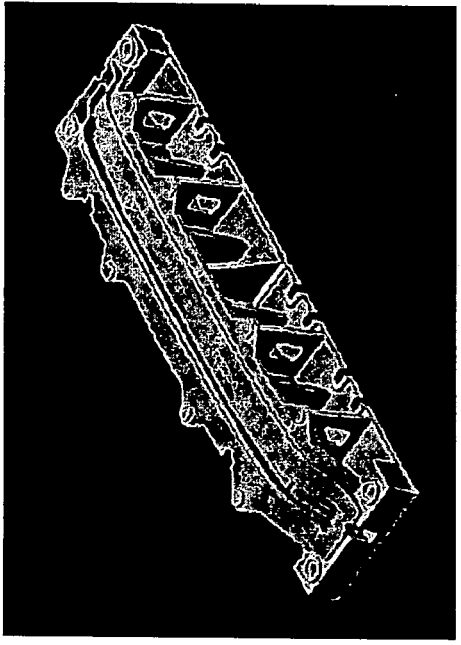
Figure 19A:
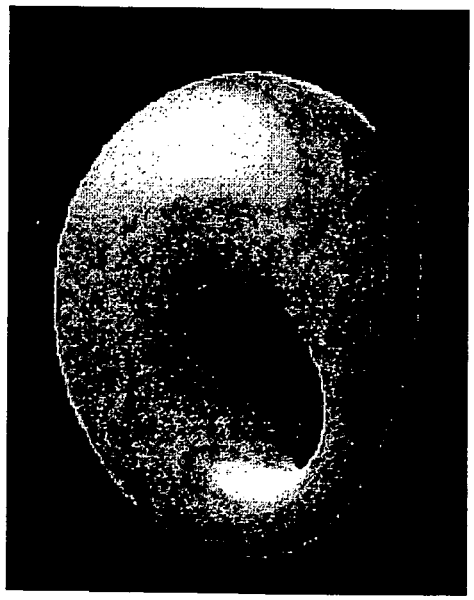
Figure 19C:
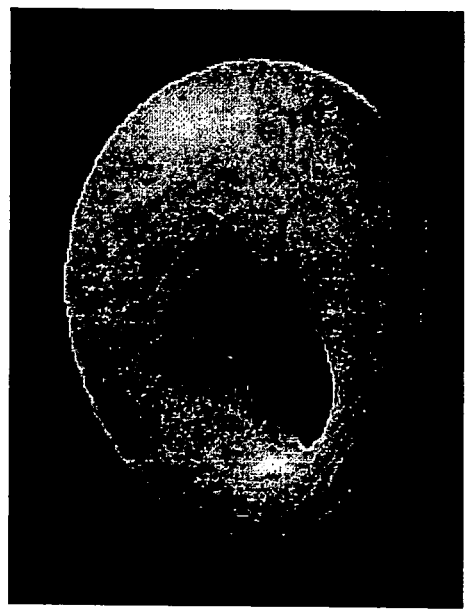

Execution using a closed loop was tried. B-rep shape representation was read to record cutting points, and a closed loop was searched therefor to carry out triangular division. Examples are a cyclide (FIG. 19a) and a mold (FIG. 19b). FIGS. 19c and 19d show restoration thereof based on cutting point information. These are generated from closed loops which are only parts of KTC surface formation possibility, but they have sufficient power of representation.

It must be emphasized that the cutting point arrangements corresponding to the closed loops are only parts of the KTC, but they do not fall within the cutting point arrangement framework of the MC. While there are only totally 14 cutting point arrangements in the MC, it is 87 kinds among the 144 cutting point arrangements of the KTC that correspond to the closed loops as described above. As an example, the cutting point arrangements of FIGS. 16a to 16c can constitute closed loops, but they are patterns nonpresent in the MC. Further, a three-dimensional version of FIG. 4f is shown in FIG. 16d.

4. Conclusion

As described above, the KTC is capable of more precise shape representation than the MC when they are compared at equal resolution. This is only natural because the equivalence classes of the cutting point triangular arrangement of the KTC completely include those of the MC.

The present invention precisely presents the diversity exhibited by the KTC on the assumption of only the broad-sense condition that the number of cutting points on one edge is at most one.

Appendix A: Two-dimensional Marching Cubes (2D-MC)

FIGS. 2a to 2d show 4 kinds of equivalence classes of the 2D-MC. These 4 patterns are obtained by using only a black and white inversion operation and a three-dimensional rotational operation on 4 vertexes of a cell. Since the MC abides by the narrow-sense condition that the number of cutting points on one edge is at most, 4 vertex patterns differently colored black and white and cutting point arrangement cases correspond to each other by 1 to 1. In FIGS. 2a to 2d, indexes of mc-0, mc-1, mc-2, and mc-3 are allocated to patterns.

The 2D-KTC is described in the section 2.1. It should be noted that the total numbers of arrangements before classification of the equivalence classes are equally 16 ($=2^4$) in the MC and the KTC in two-dimensional representation. This is attributed to the fact that the numbers of vertexes and sides of a square are both 4. (In the case of a cube, since the numbers of vertexes and edges are different from each other, the total number of cutting point arrangements is 4096 ($=2^{12}$) in the 3D-KTC while it is 256 ($=2^8$) in the 3D-MC.

Table 4 shows correspondence between the number of equivalence classes regarding cutting point arrangement, and the total number of arrangements. Table 5 shows correspondence between the cutting point arrangement of the MC and the cutting point arrangement of the KTC. The cutting point arrangements of the KTC that do not appear here, i.e., those of FIGS. 7a and 7e, are not present in the cutting point arrangement of the MC.

MC-14 is omitted for the aforementioned reason. Table 7 shows correspondence of all the cases between the MC and the KTC.

TABLE 7

Figure 11:
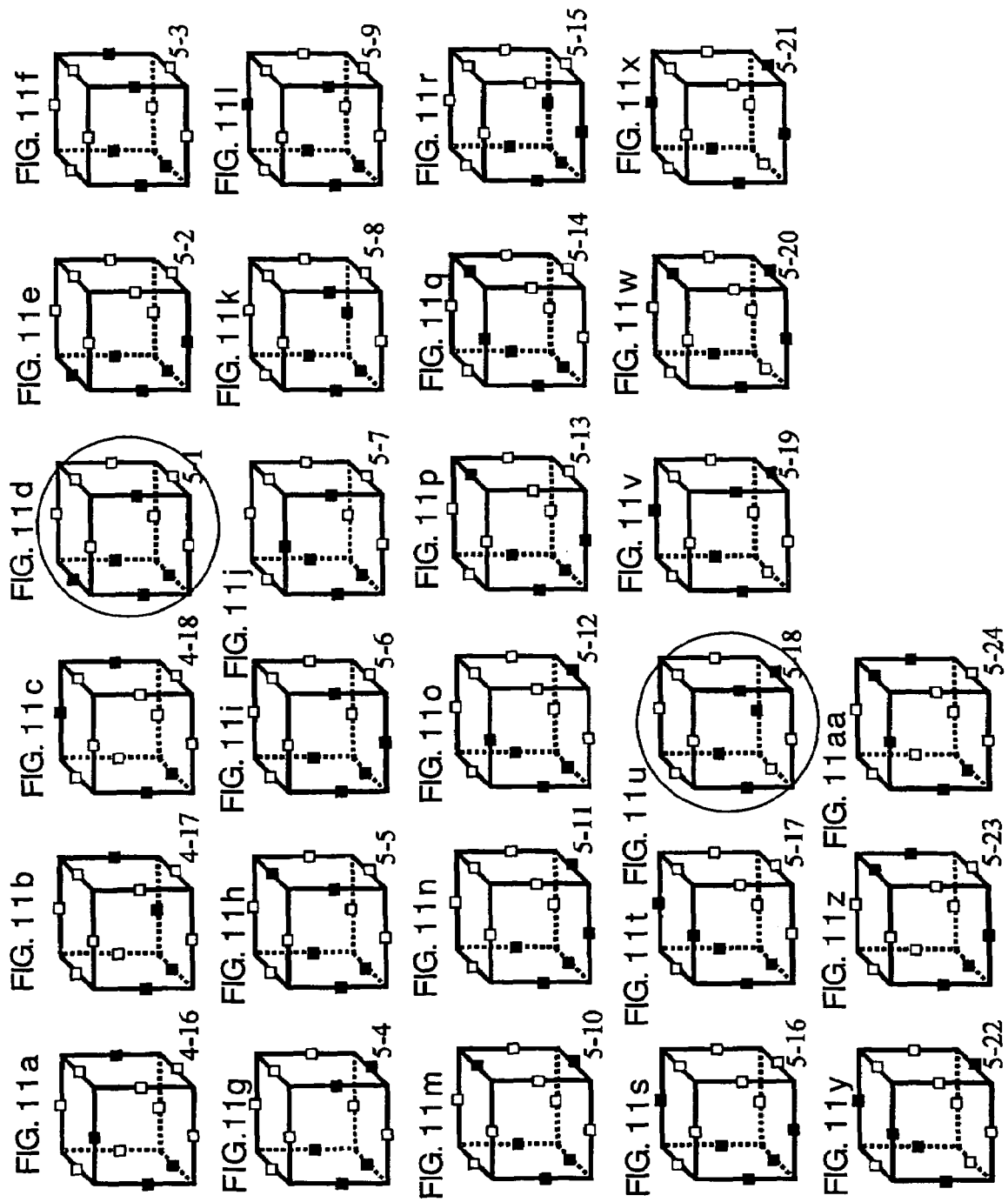
FIGS. 11a to 11aa are views showing twenty seven equivalence classes when the number of cutting points is 4 or 5 in the cutting point arrangement of the 3D-KTC.
Figure 12:
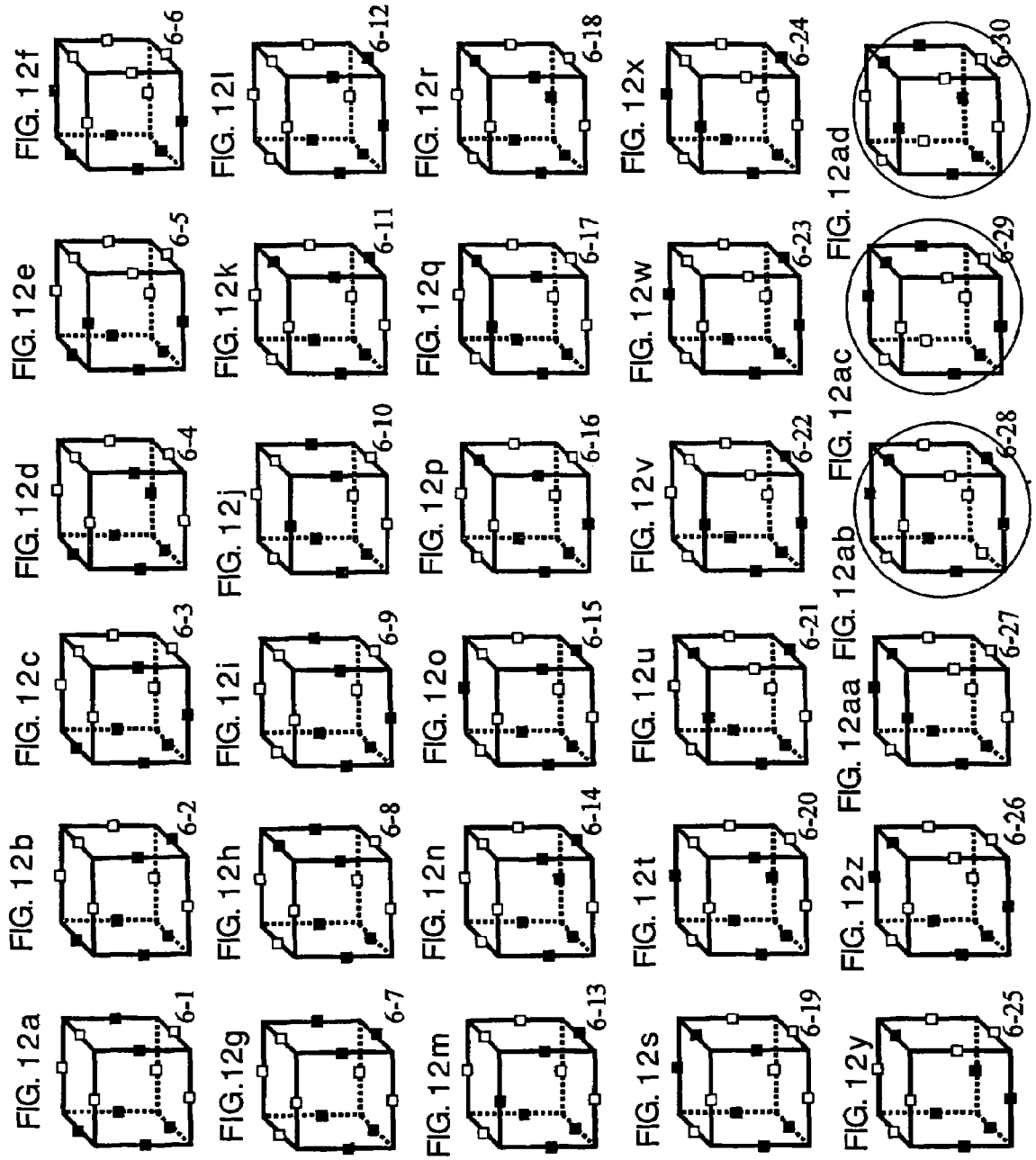
FIGS. 12a to 12ad are views showing thirty equivalence classes when the number of cutting points is 6 in the cutting point arrangement of the 3D-KTC.

| | 3D-MC index in FIGS. 3a to 3N | | | | | | | | | | | | | |
|---|---|---|---|---|---|---|---|---|---|---|---|---|---|---|
| | 0 | 1 | 2 | 3 | 4 | 5 | 6 | 7 | 8 | 9 | 10 | 11 | 12 | 13 |
| 3D-KTC index in FIGS. 10a to 10ad, FIGS. 11a to 11aa, FIGS. 12a to 12ad | 0-1 | 3-6 | 4-12 | 6-6 | 6-29 | 5-18 | 7-18 | 9-6 | 4-7 | 6-30 | 8-7 | 6-28 | 8-12 | 12-1 |

TABLE 4

| | Number of black vertexes k | | | |
|---|---|---|---|---|
| | 0(or 4) | 1(or 3) | 2 | Total(k = 0-4) |
| Total number of arrangements [4k] | 1 | 4 | 6 | 16 |
| Number of equivalence classes | 1 | 1 | 2 | 4 |

TABLE 5

| 2D-MC index in FIGS. 2a to 2d | 0 | 1 | 2 | 3 |
|---|---|---|---|---|
| 2D-KTC index in FIGS. 8a to 8v | 0(1) | 2A(1) | 2B(1) | 4(4) |

Appendix B: Three-dimensional Marching Cubes (3D-MC)

FIGS. 3a to 3n show all the equivalence classes of the MC cutting point arrangement. Operations used for classification are a black and white inversion operation, a rotational operation and a mirroring operation on vertexes. As a result, vertex coloring of 256 (=$2^8$) kinds is classified into 14 patterns. Table 6 shows an aggregation of these regarding the number of cutting points.

TABLE 6

| | Number of black vertexes: k | | | | | |
|---|---|---|---|---|---|---|
| | 0 (or 8) | 1 (or 7) | 2 (or 6) | 3 (or 5) | 4 | Total (k = 0-8) |
| Total number of black vertex arrangements: [8k] | 1 | 8 | 28 | 56 | 70 | 256 |
| Number of equivalence classes | 1 | 1 | 3 | 3 | 6 | 14 |

It should be noted that the MC is represented by totally 15 drawings of 0 to 14 in accordance with a normal MC original thesis, but only 14 are shown here (FIGS. 3a to 3n). The omitted MC-14 is reflectional symmetry of the MC-11. Since the MC-15 is uniquely decided by a mirroring operation after surface formation of the MC-11 is decided, it is omitted to maintain consistency of description of the invention (use of mirroring operation for enumeration of equivalence classes).

The FIGS. 3a to 3b are similar in lining-up to drawings of the original thesis, but a cell inner surface is omitted, and the Appendix C: Triangular division and Catalan number of polygon A problem of a folded surface in which a closed loop tracing a cell surface is an edge, i.e., triangular division of the inside of the loop, can come down to a problem of triangularly dividing a convex polygon shape on a plane in many cases. (If the entire closed loop is not planar, i.e., if a greatly bent cell inner surface is formed by the closed loop, the problem may not come down to the latter problem).

A problem of obtaining a number in the case of triangular division is known to have a relation to Catalan numbers. Only a result is described below.

Catalan number $C_m$ is represented by an equation (3) of an expression (2). In this case, when the convex n square shape (convex polygon shape) is triangularly divided by diagonal lines which do not cross each other therein, how many different ways of division are available is obtained. An obtained number $T_n$ is represented by an equation (4) of the expression (2).

[Expression 2]

$$C_n = \frac{1}{m+1}\binom{2m}{m} \quad (3)$$

$$T_n = C_{n-2} = \frac{1}{n-1}\binom{2(n-2)}{n-2} \quad (4)$$

If n=3, 4, ..., 12 are substituted for the equation, $T_3=1$, $T_4=2$, $T_5=5$, $T_6=14$, ..., $T_{12}=16796$ are obtained.

Figure 18A:
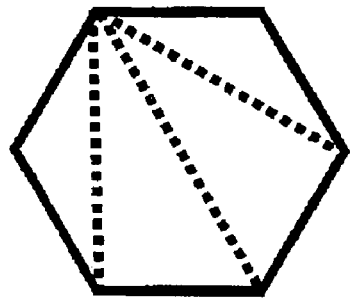
Figure 18B:
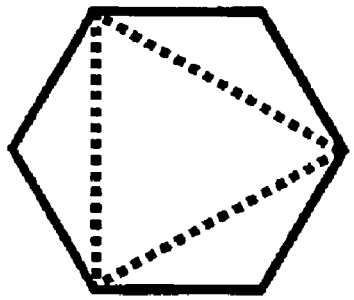
Figure 18C:
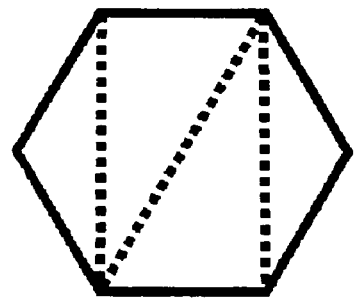

Calculation is not so difficult at n=5 or lower. Supplemental explanation is made of $T_6=14$. 14 are integrated into 3 patterns shown in FIGS. 18a to 18c by triangle rotation for a regular hexagon. FIGS. 18a to 18c show representative equivalence classes of 6, 2 and 6 triangular division methods. It can be confirmed that these are added to be 14.

As described above, according to the method and the program of the present invention, by the division step (A) and the cell classification step (D), it is possible to store the external data (12) of the object as a cell hierarchy in which the external cell (12) is divided into the orthogonal cells (13) by a small storage capacity.

In the cutting point deciding step (B), the intersection point of the boundary data and the cell edge is decided as the cell edge cutting point. Thus, it is possible to include arrangements of all the cutting points by the MC in which "one cutting point is disposed on an edge if signs of numerical values of both ends of the cell edge are different from each other, and no cutting point is disposed if signs of the numerical values are equal to each other", and to include arrangements of all the cutting points on the boundary surfaces and the cell edge lines without omission under the condition that the number of cutting points on one edge is at most one.

Further, in the boundary deciding step (C), the boundary formed by connecting the obtained cell edge cutting points is decided as the cell inner shape data. Thus, it is possible to include all the cell inner shape patterns by the MC, and to include the cell inner cut triangle arrangements without omission under the condition that the number of cutting points on one edge is at most one.

Additionally, in the boundary cell data classification step (E), the cell data constituting the boundary cell are classified into the internal cell data inside the cell inner shape data and the external cell data outside the cell inner shape data. Thus, it is possible to classify all the cell data into nonboundary and boundary cell data while maintaining continuity from the adjacent cells.

Therefore, the method and the program of the invention for converting the boundary data into the cell inner shape data are advantageous in that it is possible to include all the cell edge cutting points by the MC and all the other cell edge cutting points without omission under the condition that the number of cutting points on one edge is at most one, and it is thereby possible to include the cell inner shape data constituted of the boundary connecting the cell edge cutting points without omission.

The invention has been described by way of preferred embodiments. However, it can be understood that a scope of claims of the invention is not limited to the embodiments. As a matter of fact, all kinds of improvements, modifications and equivalents are within the scope of the appended claims of the invention.

The invention claimed is:

1. A method for converting boundary data into cell inner shape data, comprising:
    a division step (A) of dividing external data constituted of the boundary data of an object into cells in an orthogonal grid;
    a cutting point deciding step (B) of deciding an intersection point of the boundary data and a cell edge as a cell edge cutting point;
    a boundary deciding step (C) of deciding a boundary formed by connecting the cell edge cutting points as the cell inner shape data;
    a cell classification step (D) of classifying the divided cells into a nonboundary cell including no boundary surface and a boundary cell including a boundary surface;
    a boundary cell data classification step (E) of classifying cell data constituting the boundary cell into internal cell data inside the cell inner shape data and external cell data outside the cell inner shape data; and
    step (F) of outputting the cell inner shape data to a display, wherein the cells are rectangular cells in two-dimensional representation, and
    in the cutting point deciding step (B), intersection points of boundary data and cell edges that have totally $2^4=16$ arrangement cases are decided as the cell edge cutting points, and the arrangement cases that become equivalence classes by rotational operation are decided as identical patterns so that the $2^4=16$ arrangement cases are further classified into 6 patterns, and
    in the cutting point deciding step (B), as for arrangement of each intersection point, data concerning the rotational operation and data concerning the identical pattern are stored in a storage device, wherein
    in the boundary deciding step (C), a boundary line made by connecting the cell edge cutting points is decided as the cell inner shape data for all the 6 patterns.

2. The method according to claim 1, characterized in that:
    in the boundary deciding step (C), cell inner shape data patterns that become equivalence classes by three-dimensional rotational operation are decided as identical patterns so that the cell inner shape data patterns are classified into 22 patterns.

3. The method according to claim 1, further comprising the step of:
    showing images on the display using the cell inner shape data.

4. A computer readable medium encoded with a program for converting boundary data into cell inner shape data, wherein the program causes a computer to execute:
    a division step (A) of dividing external data constituted of boundary data of an object into cells in an orthogonal grid;
    a cutting point deciding step (B) of deciding an intersection point of the boundary data and a cell edge as a cell edge cutting point;
    a boundary deciding step (C) of deciding a boundary connecting formed by the cell edge cutting points as the cell inner shape data;
    a cell classification step (D) of classifying the divided cells into a nonboundary cell including no boundary surface and a boundary cell including a boundary surface;
    a boundary cell data classification step (E) of classifying cell data constituting the boundary cell into internal cell data inside the cell inner shape data and external cell data outside the cell inner shape data; and
    step (F) of outputting the cell inner shape data to a display, wherein the cells are rectangular cells in two-dimensional representation, and
    in the cutting point deciding step (B), intersection points of boundary data and cell edges that have totally $2^4=16$ arrangement cases are decided as the cell edge cutting points, and the arrangement cases that become equivalence classes by rotational operation are decided as identical patterns so that the $2^4=16$ arrangement cases are further classified into 6 patterns, and
    in the cutting point deciding step (B), as for arrangement of each intersection point, data concerning the rotational operation and data concerning the identical pattern are stored in a storage device, wherein
    in the boundary deciding step (C), a boundary line made by connecting the cell edge cutting points is decided as the cell inner shape data for all the 6 patterns.

5. The program according to claim 4, wherein the program further causes the computer to execute the step of:
    showing images on the display using the cell inner shape data.

6. A method for converting boundary data into cell inner shape data, comprising the steps of:
    (A) dividing external data constituted of the boundary data of an object into cells in an orthogonal grid;
    (B) deciding an intersection point of the boundary data and a cell edge as a cell edge cutting point;
    (C) deciding a boundary formed by connecting the cell edge cutting points as the cell inner shape data;

(D) classifying the divided cells into a nonboundary cell including no boundary surface and a boundary cell including a boundary surface;

(E) classifying cell data constituting the boundary cell into internal cell data inside the cell inner shape data and external cell data outside the cell inner shape data; and (F) outputting the cell inner shape data to a display, wherein the cells are rectangular cells in two-dimensional representation, and in step (B), intersection points of boundary data and cell edges that have totally $2^4=16$ arrangement cases are decided as the cell edge cutting points, and the arrangement cases that become equivalence classes by rotational operation are decided as identical patterns so that the $2^4=16$ arrangement cases are further classified into 6 patterns, and in step (B), as for arrangement of each intersection point, data concerning the rotational operation and data concerning the identical pattern are stored in a storage device.

7. The method according to claim 6, further comprising the step of:

showing images on the display using the cell inner shape data.

8. A computer readable medium encoded with a program for converting boundary data into cell inner shape data, wherein the program causes a computer to execute the steps comprising:

(A) dividing external data constituted of boundary data of an object into cells in an orthogonal grid;

(B) deciding an intersection point of the boundary data and a cell edge as a cell edge cutting point;

(C) deciding a boundary connecting formed by the cell edge cutting points as the cell inner shape data;

(D) classifying the divided cells into a nonboundary cell including no boundary surface and a boundary cell including a boundary surface;

(E) classifying cell data constituting the boundary cell into internal cell data inside the cell inner shape data and external cell data outside the cell inner shape data; and (F) outputting the cell inner shape data to a display, wherein the cells are rectangular cells in two-dimensional representation, and in step (B), intersection points of boundary data and cell edges that have totally $2^4=16$ arrangement cases are decided as the cell edge cutting points, and the arrangement cases that become equivalence classes by rotational operation are decided as identical patterns so that the $2^4=16$ arrangement cases are further classified into 6 patterns, and in step (B), as for arrangement of each intersection point, data concerning the rotational operation and data concerning the identical pattern are stored in a storage device.

9. The program according to claim 8, wherein the program further causes the computer to execute the step of:

showing images on the display using the cell inner shape data.

10. A method for converting boundary data into cell inner shape data, comprising:

a division step (A) of dividing external data constituted of the boundary data of an object into cells in an orthogonal grid;

a cutting point deciding step (B) of deciding an intersection point of the boundary data and a cell edge as a cell edge cutting point;

a boundary deciding step (C) of deciding a boundary formed by connecting the cell edge cutting points as the cell inner shape data;

a cell classification step (D) of classifying the divided cells into a nonboundary cell including no boundary surface and a boundary cell including a boundary surface;

a boundary cell data classification step (E) of classifying cell data constituting the boundary cell into internal cell data inside the cell inner shape data and external cell data outside the cell inner shape data; and step (F) of outputting the cell inner shape data to a display, wherein the cells are rectangular parallelepiped cells, and in the cutting point deciding step (B), intersection points of boundary data and cell edges that have totally $2^{12}=4096$ arrangement cases are decided as the cell edge cutting points, and the arrangement cases that become equivalence classes by rotational operation and mirroring operation are decided as identical patterns so that the $2^{12}=4096$ arrangement cases are further classified into 144 patterns, and in the cutting point deciding step (B), as for arrangement of each intersection point, data concerning the rotational operation and mirroring operation and data concerning the identical pattern are stored in a storage device, wherein in the boundary deciding step (C), a boundary line made by connecting the cell edge cutting points is decided as the cell inner shape data for all the 144 patterns.

11. The method according to claim 10, characterized in that:

in the cutting point deciding step (B), the cell edge cutting point patterns that become equivalence classes by an inversion operation regarding presence/nonpresence of cutting points are decided as identical patterns so that the cell edge cutting point patterns are classified into 87 patterns in which the number of the cell edge cutting points is 0 to 6.

12. The method according to claim 10, further comprising the step of:

showing images on the display using the cell inner shape data.

13. A method for converting boundary data into cell inner shape data, comprising the steps of:

(A) dividing external data constituted of the boundary data of an object into cells in an orthogonal grid;

(B) deciding an intersection point of the boundary data and a cell edge as a cell edge cutting point;

(C) deciding a boundary formed by connecting the cell edge cutting points as the cell inner shape data;

(D) classifying the divided cells into a nonboundary cell including no boundary surface and a boundary cell including a boundary surface;

(E) classifying cell data constituting the boundary cell into internal cell data inside the cell inner shape data and external cell data outside the cell inner shape data; and (F) outputting the cell inner shape data to a display, wherein the cells are rectangular parallelepiped cells, and in step (B), intersection points of boundary data and cell edges that have totally $2^{12}=4096$ arrangement cases are decided as the cell edge cutting points, and the arrangement cases that become equivalence classes by rotational operation and mirroring operation are decided as identical patterns so that the $2^{12}$=4096 arrangement cases are further classified into 144 patterns, and in step (B), as for arrangement of each intersection point, data concerning the rotational operation and mirroring operation and data concerning the identical pattern are stored in a storage device.

14. The method according to claim 13, further comprising the step of:

showing images on the display using the cell inner shape data.

15. A computer readable medium encoded with a program for converting boundary data into cell inner shape data, wherein the program causes a computer to execute:

a division step (A) of dividing external data constituted of the boundary data of an object into cells in an orthogonal grid;

a cutting point deciding step (B) of deciding an intersection point of the boundary data and a cell edge as a cell edge cutting point;

a boundary deciding step (C) of deciding a boundary formed by connecting the cell edge cutting points as the cell inner shape data;

a cell classification step (D) of classifying the divided cells into a nonboundary cell including no boundary surface and a boundary cell including a boundary surface;

a boundary cell data classification step (E) of classifying cell data constituting the boundary cell into internal cell data inside the cell inner shape data and external cell data outside the cell inner shape data; and step (F) of outputting the cell inner shape data to a display, wherein the cells are rectangular parallelepiped cells, and in the cutting point deciding step (B), intersection points of boundary data and cell edges that have totally $2^{12}$=4096 arrangement cases are decided as the cell edge cutting points, and the arrangement cases that become equivalence classes by rotational operation and mirroring operation are decided as identical patterns so that the $2^{12}$=4096 arrangement cases are further classified into 144 patterns, and in the cutting point deciding step (B), as for arrangement of each intersection point, data concerning the rotational operation and mirroring operation and data concerning the identical pattern are stored in a storage device, wherein in the boundary deciding step (C), a boundary line made by connecting the cell edge cutting points is decided as the cell inner shape data for all the 144 patterns.

16. The program according to claim 15, wherein the program further causes the computer to execute the step of:

showing images on the display using the cell inner shape data.

17. A computer readable medium encoded with a program for converting boundary data into cell inner shape data, wherein the program causes a computer to execute the steps comprising:

(A) dividing external data constituted of the boundary data of an object into cells in an orthogonal grid;

(B) deciding an intersection point of the boundary data and a cell edge as a cell edge cutting point;

(C) deciding a boundary formed by connecting the cell edge cutting points as the cell inner shape data;

(D) classifying the divided cells into a nonboundary cell including no boundary surface and a boundary cell including a boundary surface;

(E) classifying cell data constituting the boundary cell into internal cell data inside the cell inner shape data and external cell data outside the cell inner shape data; and (F) outputting the cell inner shape data to a display, wherein the cells are rectangular parallelepiped cells, and in step (B), intersection points of boundary data and cell edges that have totally $2^{12}$=4096 arrangement cases are decided as the cell edge cutting points, and the arrangement cases that become equivalence classes by rotational operation and mirroring operation are decided as identical patterns so that the $2^{12}$=4096 arrangement cases are further classified into 144 patterns, and in step (B), as for arrangement of each intersection point, data concerning the rotational operation and mirroring operation and data concerning the identical pattern are stored in a storage device.

18. The program according to claim 17, wherein the program further causes the computer to execute the step of:

showing images on the display using the cell inner shape data.

* * * * *